United States Patent
Kitagawa

(10) Patent No.: US 8,238,138 B2
(45) Date of Patent: Aug. 7, 2012

(54) SEMICONDUCTOR MEMORY DEVICE AND ITS OPERATION METHOD

(75) Inventor: Makoto Kitagawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 206 days.

(21) Appl. No.: 12/805,089

(22) Filed: Jul. 12, 2010

(65) Prior Publication Data

US 2011/0026332 A1 Feb. 3, 2011

(30) Foreign Application Priority Data

Aug. 3, 2009 (JP) ................................ 2009-180575

(51) Int. Cl.
*G11C 11/00* (2006.01)
(52) U.S. Cl. ........................................ 365/148; 365/163
(58) Field of Classification Search .................. 365/148, 365/163, 207
See application file for complete search history.

(56) References Cited

U.S. PATENT DOCUMENTS

2009/0040814 A1* 2/2009 Kang et al. ................... 365/163
2009/0296458 A1* 12/2009 Lee et al. ..................... 365/163
2010/0226164 A1* 9/2010 Nagashima et al. .......... 365/148

FOREIGN PATENT DOCUMENTS

| JP | 3142335 | 12/2000 |
|----|---------|---------|
| JP | 2006-302465 | 11/2006 |
| JP | 2007-133930 | 5/2007 |

OTHER PUBLICATIONS

K. Arantani et al., "A Novel Resistance Memory with High Scalability and Nanosecond Switching," Technical Digest IEDM 2007, pp. 783-786.

* cited by examiner

*Primary Examiner* — Anh Phung
(74) *Attorney, Agent, or Firm* — Rader Fishman & Grauer, PLLC

(57) ABSTRACT

Disclosed herein is a semiconductor memory device including: a bit line and a sense line; a data storage element having a data storage state changing in accordance with a voltage applied to the bit line; a first switch for controlling connection of the sense line to the bit line; a data latch circuit having a second data holding node and a first data holding node connected to the sense line; and a second switch for controlling connection of the second data holding node of the data latch circuit to the bit line.

10 Claims, 22 Drawing Sheets

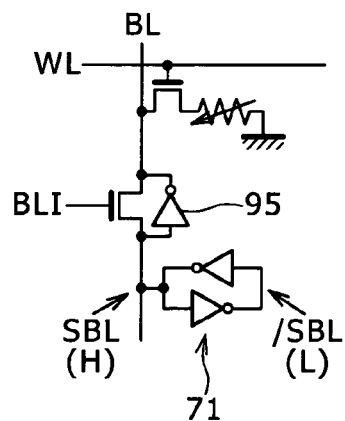

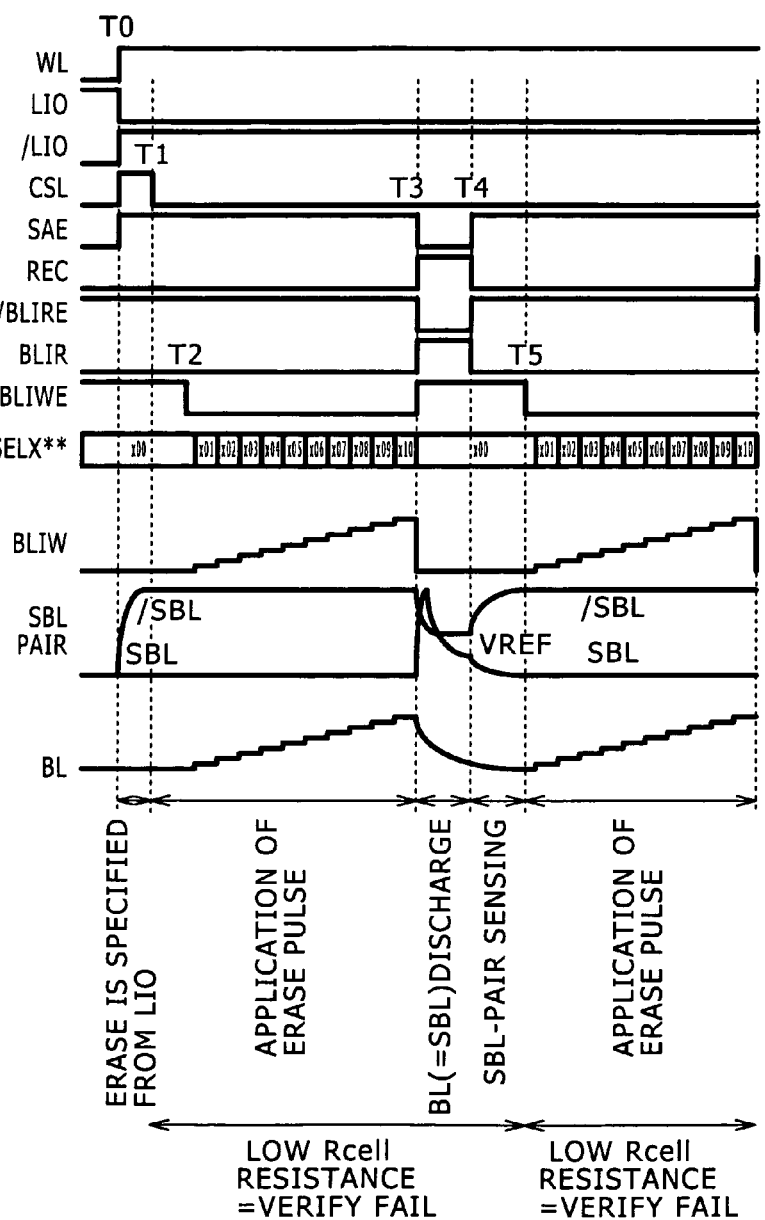

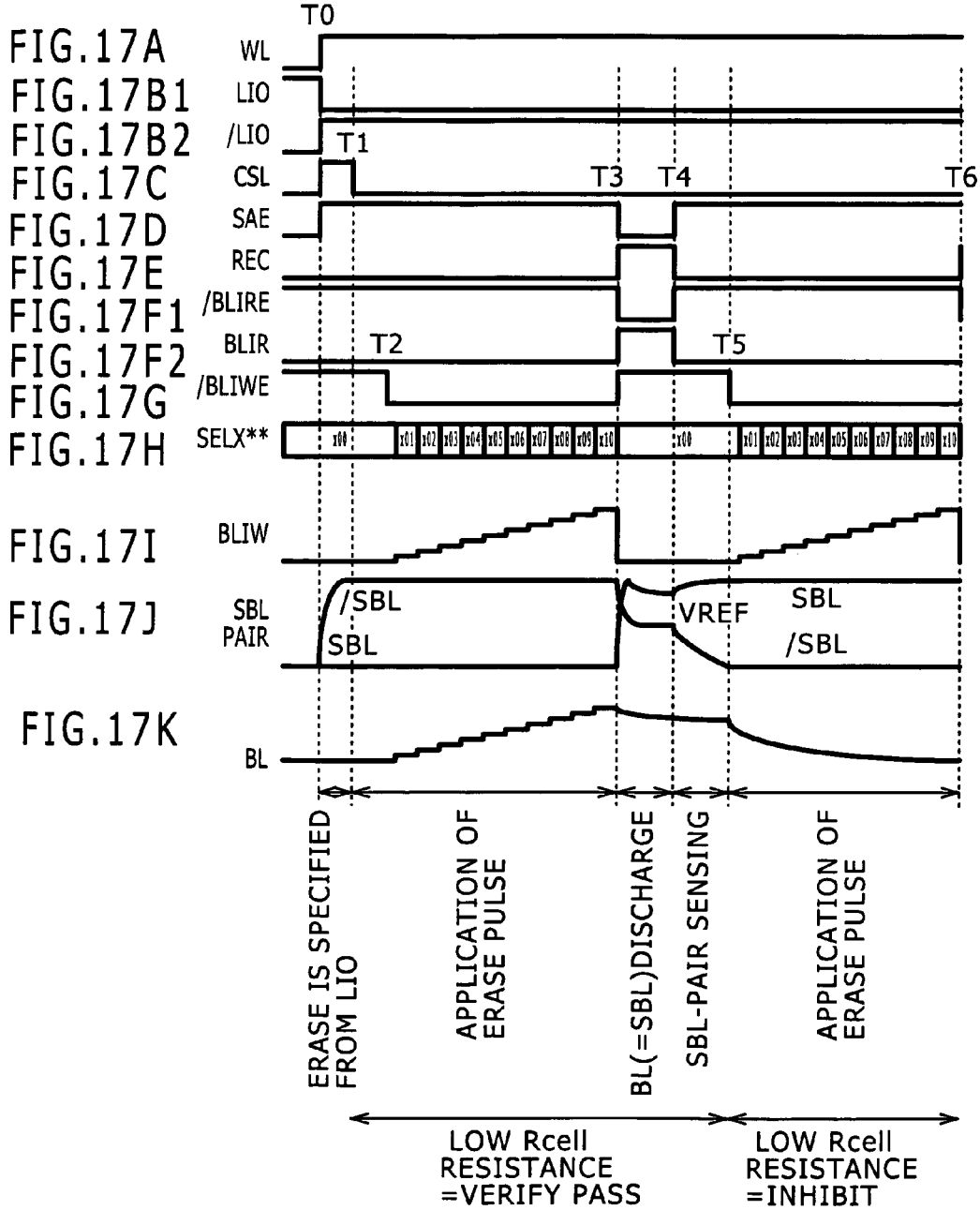

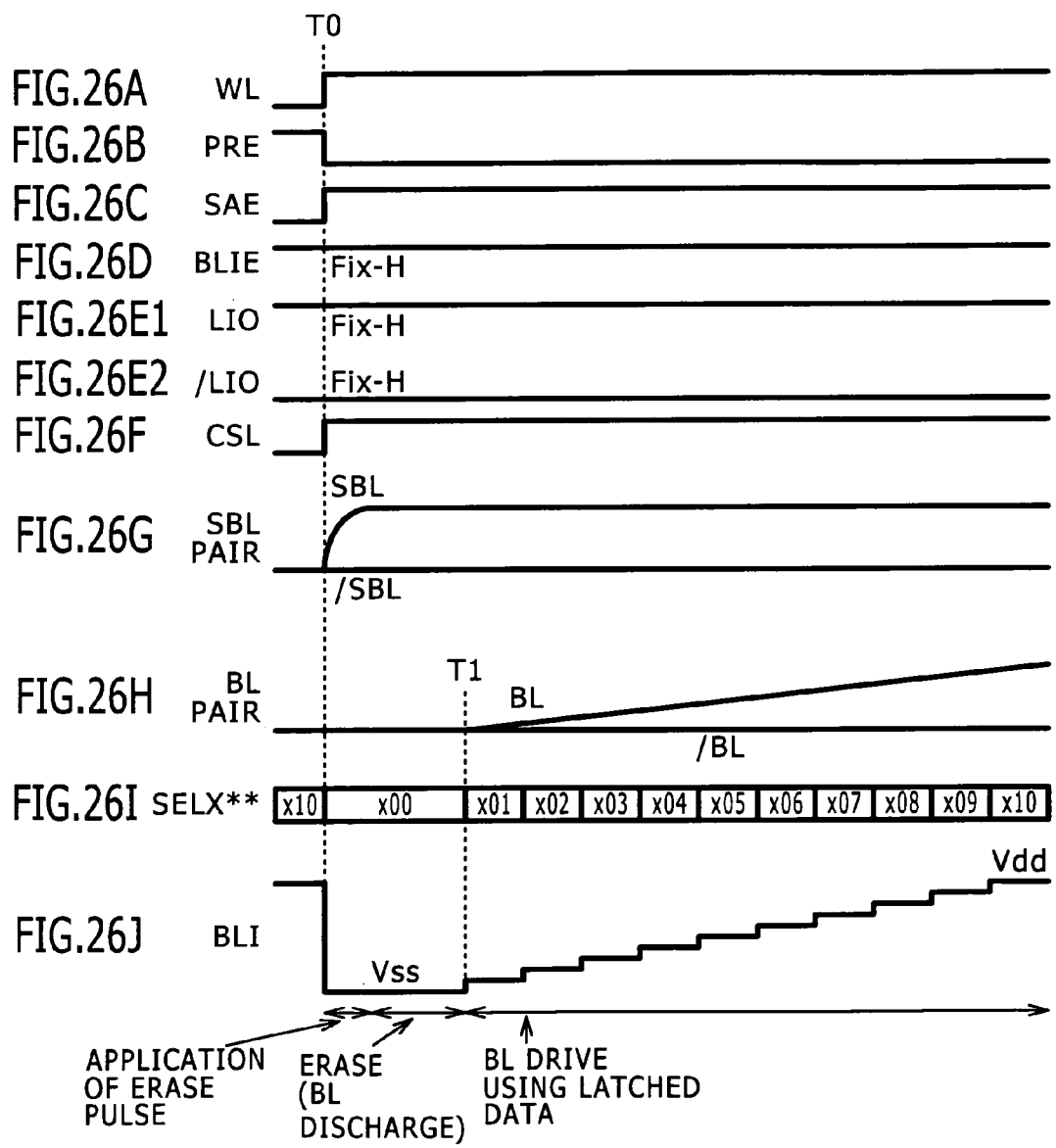

SEMICONDUCTOR MEMORY DEVICE AND ITS OPERATION METHOD

BACKGROUND OF THE INVENTION

1. Field of the Invention

The present invention relates to a semiconductor memory device with its data storage state changing in accordance with a voltage applied to a bit line connected to the device and relates to a method for operating the device.

2. Description of the Related Art

There is known a nonvolatile memory device including a data storage element with a data storage state which changes in accordance with a voltage applied to a bit line connected to the device.

Representative examples of a memory device are volatile memory devices such as DRAMs (Dynamic Random Access Memories) and SRAMs (Static Random Access Memories). Another representative example of the memory device is a nonvolatile (flash) EEPROM (Electrically Erasable Programmable Read Only Memory) represented by an FG (Floating Gate)-type memory. For more information, the reader is requested to refer to Japanese Patent No. 3142335 (hereinafter referred to as Patent Document 1).

By the way, there is also a nonvolatile memory device which allows data stored in the device to be updated at a high speed. Such a nonvolatile memory device can be used as an FG-type (flash) EEPROM which allows data stored in the FG-type (flash) EEPROM to be updated at a high speed. A typical example of such a nonvolatile memory device is a variable-resistance memory device which draws much attention.

As a typical example of such a variable-resistance memory device, there is known the so-called ReRAM (Resistance Random Access Memory) having a data storage state changed by a resistance variation which is obtained as a result of supplying conductive ions to a conductive film employed in a data storage element of the variable-resistance memory device and drawing conductive ions from the conductive film. For more information on the ReRAM, the reader is requested to refer to Japanese Patent. Laid-Open No. 2007-133930 (hereinafter referred to as Patent Document 2) or document such as K. Aratani, et al., "A Novel Resistance Memory with High Scalability and Nanosecond Switching," Technical Digest IEDM 2007, pp. 783-786 (hereinafter referred to as Non-Patent Document 1).

As another example of the variable-resistance memory device, there is known a variable-phase memory device in which a phase variation occurring at a crystallization time of a conductive film employed in a data storage element of the variable-resistance memory device is controlled by the magnitude of a current flowing through the variable-resistance memory device and the length of the flowing time of the current. For more information on the variable-phase memory device, the reader is requested to refer to Japanese Patent Laid-Open No. 2006-302465 (hereinafter referred to as Patent Document 3).

As further examples of the variable-resistance memory device, there are known an MRAM (Magnetoresistive Random Access Memory) and a spin injection memory. That is to say, the MRAM and the spin injection memory can be classified as memory devices that have the same type as the variable-resistance memory device. The MRAM is a memory device in which the direction of magnetization of a magnetic film employed in the memory device is determined by the direction of a current flowing through the memory device and the magnitude of the current.

The variable-resistance memory devices including the (flash) EEPROM pertain to a category of nonvolatile memory devices in each of which the data storage state of a data storage element employed by the device changes in accordance with a voltage applied to a bit line connected to the device.

The (flash) EEPROM employs a memory transistor which serves as a data storage element. In the (flash) EEPROM, the data storage state of the data storage element changes due to injection of electric charges into a charge trap or an FG (Floating Gate) created in a gate insulation film.

With miniaturization of the data storage element, however, injection of electric charges becomes difficult to control. In addition, in order to implement a multi-value memory, the so-called write-verify operation is normally carried out. For details, the reader is requested to refer to Patent Document 1.

Even in a variable-resistance memory device such as the ReRAM, a verify operation may be carried out at a data write or erase time in some cases. This is because there are cases in which post-write data or post-erase data depends on the number of times the data update (that is, write or erase) operation is carried out. In the case of a variable-resistance memory device, the post-write data or the post-erase data is represented by the resistance of a data storage element employed in the device. For more information, the reader is requested to refer to Patent Document 2.

Patent Document 2 discloses a high-speed sequence of operations excluding a pre-charge process supposed to be carried out after a data write operation. That is to say, after a write bias for the data write operation has been removed, a read-to-verify operation based on electric charge stored on a bit line connected to the variable-resistance memory device is carried out.

To put it in detail, Patent Document 2 discloses a technology, in accordance with which a verify operation is carried out after a data write or erase operation by reading out post-write data or post-erase data in order to determine whether or not the data write or erase operation has been carried out with a high degree of sufficiency. The process of determining whether or not the data write or erase operation has been carried out with a high degree of sufficiency is referred to as a verify process. By carrying out the sequence of the data write or erase and verify operations repeatedly in accordance with this technology, it is possible to prevent an incorrect data write or erase operation from being performed. With regard to the verify operation, inhibit control that can be executed by a simple circuit and with a high degree of reliability is of importance. The inhibit control is control to inhibit the next verify operation if the result of the present verify operation indicates that the data write or erase operation has been carried out successfully.

Patent Document 1 discloses a (flash) EEPROM including a bit-line control circuit which employs a data latch/sense amplifier for latching data to be written into a data storage element employed in the EEPROM and for sensing data read out from the data storage element. By employing the data latch/sense amplifier for latching data to be written into a data storage element employed in the EEPROM and for sensing data read out from the data storage element, the size of a verify-operation control circuit can be reduced.

Patent Document 3 discloses a variable-phase memory device carrying out a selective reset operation by utilizing data latched in a data latch circuit which also functions as a data sense amplifier. The selective reset operation is an operation carried out in order to set a bit-line voltage for the next data write operation. The selective reset operation is carried out not for the purpose of verification, but for the purpose of making sequential random accesses. The data latch circuit functions also as a data latch amplifier for latching data to be written into the data storage element.

SUMMARY OF THE INVENTION

The bit-line control circuit employing the data latch/sense amplifier as described in Patent Document 1 controls the pre-charge circuit at a read time in a read-to-verify operation by utilizing data held in the data latch/sense amplifier which is referred to hereafter simply as a data latch circuit. To put it in detail, the data held in the data latch amplifier is not pre-charged directly to the bit line. Instead, the data held in the data latch amplifier is used for controlling a switch of a supply line for conveying a voltage generated by a power supply. The supply line for conveying a voltage generated by a power supply is also referred to as a Vcc pre-charge line.

In addition, as described in Patent Document 1, a logic operation is carried out on data read out from a memory cell including the data storage element cited earlier and data latched in a data latch circuit and, then, rewrite data is automatically set in the data latch circuit for each bit in accordance with the write state. For more information, the reader is requested to refer to claim 1 of Patent Document 1. This is a typical example of an inhibit-state setting state implemented by carrying out on an operation of the data latch circuit as an inhibit setting state of the verify operation.

To put it more concretely, in an inhibit process after a write operation, write data used in the immediately preceding data write operation is held in the data latch circuit as write data. In this state, a pair of bit lines is detached from the data latch circuit and, after the bit line serving as the subject of a read operation is pre-charged to (½) Vcc, the bit line is put in a floating state. Then, the other adjacent bit line is fixed at (½) Vcc. At that time, the data held in the data latch circuit as write data is used for determining whether it is necessary to further pre-charge the bit line serving as the subject of a read operation to Vcc.

Thereafter, the data held in the data latch circuit as write data is reset. The write data has been substantially held in the data latch circuit in accordance with whether the electric potential of the BL (bit line) serving as the subject of a read operation is (½) Vcc or the electric potential of the BL (bit line) has been an electric potential obtained as a result of an operation to pre-charge the bit line serving as the subject of a read operation to Vcc. In this state, the data latch circuit also serving as a data sense amplifier is activated and the pair of bit lines is sequentially connected to the data sense circuit so that memory-cell data is read out from the BL (bit line) serving as the subject of a read operation. The memory-cell data read out from the BL (bit line) serving as the subject of a read operation is latched in the data latch circuit to be used as data of the next rewrite operation. At that time, the rewrite data held in the data latch circuit is converted from data read out from the memory cell at a read-to-verify operation in accordance with previous write data, that is, in accordance with whether or not the bit line has been pre-charged to Vss. Thus, the inhibit state is automatically set.

The read-to-verify operation includes a process in which the write data is saved in a memory outside the data latch circuit as a bit-line pre-charge electric potential and, then, the data latch memory is reset. However, the memory outside the data latch circuit is a memory connected to a bit line in the array of memory cells. Therefore, the sequence of read-to-verify and inhibit-setting operations becomes complicated, giving rise to a hindrance to an effort to raise the speed of the operations. In addition, since the bit line on the adjacent column of memory cells is used as a reference electric-potential line, the operations can be carried out on only an odd-numbered column of memory cells in the array of memory cells or an even-numbered column of memory cells in the array of memory cells. As a result, the operation efficiency of the memory device is poor.

On top of that, the circuits of memory device require a (½) Vcc pre-charge circuit and a Vcc pre-charge circuit (or a Vcc pre-charge path). Thus, the circuit area is inevitably large due to the use of the two pre-charge circuits.

It is to be noted that the variable-phase memory disclosed in Patent Document 3 has a circuit configuration in which data held in the data latch circuit can be set directly on a bit line by turning on a switch connected between the bit line and the data holding node of the data latch circuit.

However, Patent Document 3 describes control of an operation to hold write data in the data latch circuit functioning also as a data sense amplifier in a first cycle and describes control of repeated execution of an operation thereafter to write the data stored in the data latch circuit into memory cells consecutively a number of times in random accesses to the memory cells in the same way as the SDRAM.

Thus, the variable-phase memory does not have a configuration in which a read-to-verify operation carried out after every data write operation as a verify operation including a read operation is not taken into consideration. As a result, the inhibit-state setting operation is also of course not taken into consideration. That is to say, the circuit configuration described in Patent Document 3 is not capable of carrying out the read-to-verify operation and the inhibit-state setting operation at a high speed.

As is obvious from the above descriptions, there has not been proposed yet a simple circuit configuration capable of carrying out the read-to-verify operation and the inhibit-state setting operation at a high speed as operations performed concurrently on adjacent memory-cell columns, the number of which is determined in advance, in order to implement a high update transfer rate.

Addressing the problems described above, inventors of the present invention have proposed a volatile or nonvolatile semiconductor memory device having a circuit configuration which is capable of making use of a simple circuit in order to carry out the next update-pulse write setting and inhibit-state setting after a read process performed as a part of a read-to-verify operation for a bit line at a high speed.

In addition, the inventors of the present invention have also proposed a method for operating a volatile or nonvolatile semiconductor memory device having a circuit configuration which is capable of making use of a simple circuit in order to carry out the next update-pulse write setting and inhibit-state setting after a read process performed as a part of a read-to-verify operation for a bit line at a high speed.

A semiconductor memory device according to an embodiment of the present invention employs a bit line, a sense line, a data storage element, a first switch, a data latch circuit and a second switch.

The data storage state of the data storage element changes in accordance with a voltage applied to the bit line. The data storage element can be any data storage element such as a nonvolatile memory such as a DRAM or an SRAM, any one of a variety of variable-resistance memory and any other nonvolatile memory such as a (flash) EEPROM.

The first switch is a switch for controlling the connection of the sense line to the bit line.

The data latch circuit has first and second data holding nodes. The first data holding node is connected to the sense line whereas the second data holding node is connected to an inverted sense line /SBL shown in FIG. 10.

The second switch provided on the inverted sense line /SBL is a switch for controlling the connection of the second data holding node of the data latch circuit to the bit line.

In a data update operation, that is, a data write operation or a data erase operation, the semiconductor memory device according to an embodiment of the present invention puts the second switch in a turned-on state in order to apply a data update pulse to the data storage element on the basis of information held at the second data holding node. Then, the first switch is put in a turned-on state in order to detect an electric potential appearing on the bit line in a read-to-verify operation carried out by the data latch circuit as an operation to detect an electric potential appearing on the bit line by taking a reference electric potential given to the second data holding as a comparison reference. In the following description, the electric potential appearing on the bit line is referred to as a BL electric potential. In addition, the data latch circuit makes use of the data, which has been latched therein after the execution of the read-to-verify operation, as information used for determining whether or not it is necessary to apply of the next data update pulse to the data storage element.

In accordance with the configuration described above, the read-to-verify operation also referred to as the so-called direct read-to-verify operation is carried out. Prior to the direct read-to-verify operation, a data update pulse is applied to the data storage element in order to carry out a data update operation (that is, a data erase operation or a data write operation) by making use of data latched in the data latch circuit as the BL electric potential. It is to be noted that the data latched in the data latch circuit appears as the inverted electric potential of the electric potential latched in the data latch circuit. In the following description, the inverted electric potential of the electric potential latched in the data latch circuit is referred to simply as an inverted latched electric potential of the second data holding node of the data latch circuit. The BL electric potential appearing after the data erase operation or the data write operation becomes the data update pulse, which is used in the direct read-to-verify operation following the data erase operation or the data write operation, as it is. To put it more concretely, when the second switch is put in a turned-off state to terminate the data update operation and start the direct read-to-verify operation, the first switch has been put in a turned-off state so that the bit line is put in a high-impedance state. Thus, at the BL electric potential appearing on the bit line put in a high-impedance state, a read current flows to the data storage element in a so-called read operation carried out as a part of the direct read-to-verify operation. Since the magnitude of this read current varies in accordance with the data storage state of the data storage element, changes of the BL electric potential also vary in accordance with the data storage state.

Then, the first switch is put in a turned-on state. With the first switch put in a turned-on state, a change of the BL electric potential propagates as a change of an electric potential appearing on the first data holding node of the data latch circuit. Prior to the operation to put the first switch in a turned-on state, a reference electric potential has been applied to the second data holding node of the data latch circuit. Thus, the data latch circuit converts the BL electric-potential change relative to the reference electric potential serving as a reference into a signal having an amplitude equal to the amplitude of a power supply provided for the data latch circuit. Since the BL electric potential is determined by the data storage state of the data storage element, the data latch circuit substantially converts the data storage state of the data storage element into the signal having an amplitude equal to the amplitude of a power supply provided for the data latch circuit.

As an example, the following description explains a typical case in which the BL electric potential decreases in accordance with a change of the data storage state.

In this typical case, if the BL electric potential appearing after the data write operation is relatively large in comparison with the reference electric potential, it is assumed that the data write operation has not been successful in sufficiently changing the data storage state of the data storage element so that a data rewrite operation to sufficiently change the data storage state needs to be carried out by reapplying a data write pulse serving as a bias to the bit line. Due to an operation carried out by the data latch circuit at that time, the second data holding node of the data latch circuit sustains the inverted latched electric potential at a high level.

If the BL electric potential appearing after the data write operation is relatively small in comparison with the reference electric potential, on the other hand, it is assumed that the data write operation has been successful in sufficiently changing the data storage state of the data storage element so that a data rewrite operation to sufficiently change the data storage state does not need to be carried out by reapplying a data write pulse serving as a bias to the bit line. Thus, the second data holding node of the data latch circuit sustains the inverted latched electric potential at a low level to indicate an inhibit state.

The data latch circuit makes use of the inverted latched electric potential of the second data holding node of the data latch circuit as information used for determining whether or not it is necessary to apply the next data update pulse (that is, the next data write pulse or the next data erase pulse) to the memory cell MC. That is to say, in the case of the typical configuration described above for example, if a data write pulse serving as a bias needs to be reapplied to the bit line, the high-level inverted latched electric potential of the second data holding node of the data latch circuit is supplied to the bit line through the second switch as a high-level bit-line bias. If a data write pulse serving as a bias does not need to be reapplied to the bit line, on the other hand, the second data holding node of the data latch circuit sustains the inverted latched electric potential at a low level to indicate an inhibit state. In this case, even if the inverted latched electric potential set at a low level to indicate an inhibit state is supplied to bit line through the second switch, the inverted latched electric potential is not used as a data update pulse which serves as a bias applied to the data storage element. Thus, the data write operation (and the data erase operation) are virtually inhibited.

In accordance with the present invention, it is possible to provide a volatile or nonvolatile semiconductor memory device having a circuit configuration which is capable of making use of a simple circuit in order to carry out the next update-pulse write setting and inhibit-state setting after a read process executed as a part of a read-to-verify operation for a bit line at a high speed.

In addition, in accordance with the present invention, it is possible to provide an operation method for operating a volatile or nonvolatile semiconductor memory device having a circuit configuration which is capable of making use of a simple circuit in order to carry out the next update-pulse write setting and inhibit-state setting after a read process executed as a part of a read-to-verify operation for a bit line at a high speed.

BRIEF DESCRIPTION OF THE DRAWINGS

FIGS. 14A and 14B1 to 14B3 are a plurality of diagrams showing another typical comparison circuit (a sort of comparison circuit) including an additional transfer inverter for inhibit-state setting and timing charts of some signals;

FIGS. 16A to 16K are a plurality of diagrams each showing the operation waveform (or the timing chart) of a signal for a case in which it is necessary to apply an additional data erase pulse to the memory cell in the event of an erase failure detected in the first embodiment;

FIGS. 17A to 17K are a plurality of diagrams each showing the operation waveform (or the timing chart) of a signal for a case in which it is not necessary to apply an additional data erase pulse to the memory cell in the event of an erase success detected in the first embodiment;

FIGS. 26A to 26J are a plurality of diagrams each showing the operation waveform (or the timing chart) of a signal generated in the configurations shown in FIG. 25.

DETAILED DESCRIPTION OF THE PREFERRED EMBODIMENTS

By referring to the diagrams described above, the following description explains preferred embodiments which each implement mainly a variable-resistance memory device according to an embodiment of the present invention.

The preferred embodiments are explained in chapters which are arranged in the following order:

Chapter 1

First Embodiment

This chapter explains a first embodiment implementing a variable-resistance memory device according to the first embodiment of the present invention. The first embodiment has a circuit configuration in which an NMOS transistor is used as the second switch explained earlier. In addition to the circuit configuration, this chapter also describes a data erase operation representing operations carried out by the first embodiment.

Chapter 2

Second Embodiment

This chapter explains a second embodiment implementing a variable-resistance memory device according to the second embodiment of the present invention. The second embodiment has a circuit configuration in which a PMOS transistor is used as the second switch explained earlier. In addition to the circuit configuration, this chapter also describes a data erase operation representing operations carried out by the first embodiment.

Chapter 3

Configuration for Read Operations and Operations in the Configuration

This chapter explains the configuration of a typical circuit designed in a variable-resistance memory device according to an embodiment of the present invention to serve as a circuit for performing read operations and explains operations carried out by the circuit. The typical circuit can be employed in both the first and second embodiments. In addition to the configuration of the circuit, this chapter also describes operations carried out by the circuit.

Chapter 4

Typical Application to DRAMs

This chapter explains typical application of the present invention to a DRAM used as a memory device according to an embodiment of the present invention. The DRAM adopts a technology for changing the gate voltage of a BLI switch on a step-by-step basis in order to avoid unintentional latch inversions.

Chapter 5

Typical Application to SRAMs

This chapter explains typical application of the present invention to an SRAM used as a memory device according to an embodiment of the present invention. The SRAM adopts a technology for changing the gate voltage of a BLI switch on a step-by-step basis in order to avoid unintentional latch inversions.

Chapter 1

First Embodiment

Configuration of a Memory Cell

Figure 1A:
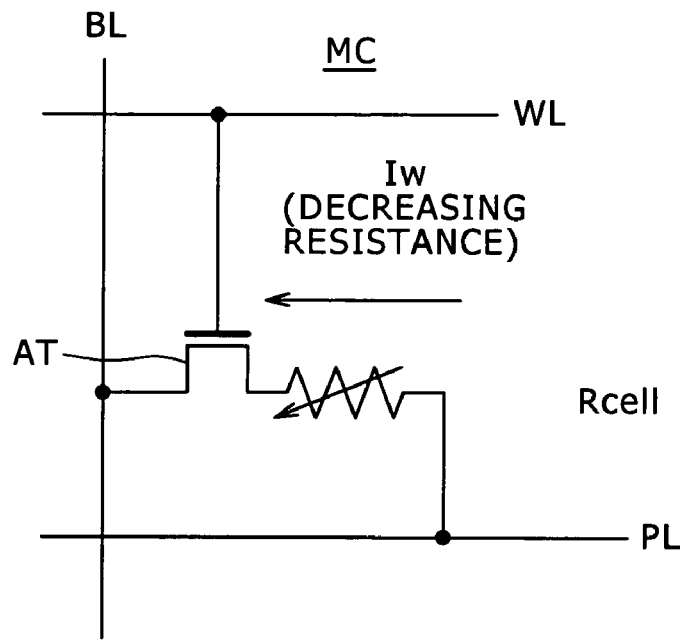
FIGS. 1A and 1B are a plurality of diagrams each showing an equivalent circuit of a memory cell common to embodiments of the present invention.
Figure 1B:
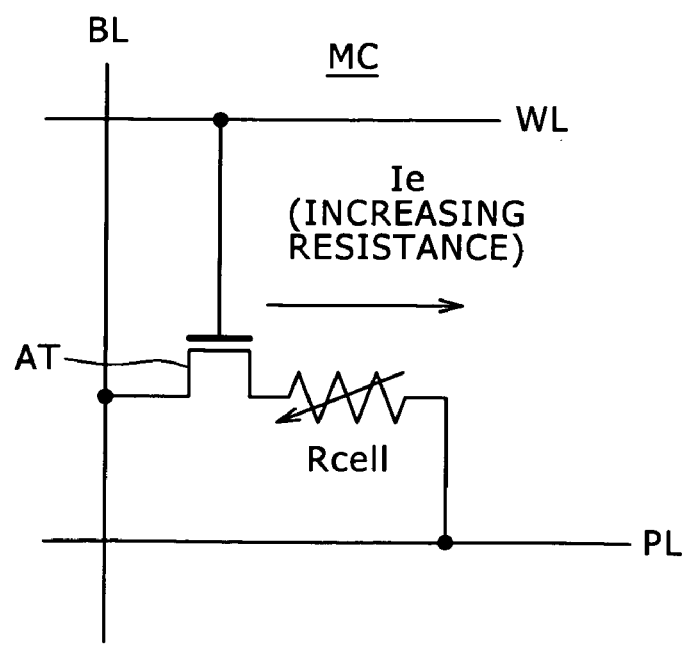

FIGS. 1A and 1B are a plurality of diagrams each showing an equivalent circuit of a memory cell MC common to embodiments of the present invention. To be more specific, FIG. 1A is a diagram particularly showing the direction of a write circuit Iw in the equivalent circuit. On the other hand, FIG. 1B is a diagram particularly showing the direction of an erase circuit Ie in the equivalent circuit. As is obvious from the diagrams of both FIGS. 1A and 1B, the memory-cell configurations themselves are identical to each other.

The memory cell MC shown in each of the diagrams of FIGS. 1A and 1B employs the variable-resistance cell resistor Rcell and an access transistor AT. Used as a data storage element, the variable-resistance cell resistor Rcell is a resistor having a variable resistance.

A specific one of the two ends of the variable-resistance cell resistor Rcell is connected to a plate line PL whereas the other one of the two ends of the variable-resistance cell resistor Rcell is connected to the source electrode of the access transistor AT. The drain electrode of the access transistor AT is connected to a bit line BL whereas the gate of the access transistor AT is connected to a word line WL which is used as an access line.

As shown in FIGS. 1A and 1B, the bit line BL and the plate line PL are perpendicular to each other. It is to be noted, however, that the bit line BL and the plate line PL can also be provided as lines parallel to each other.

Figure 2:
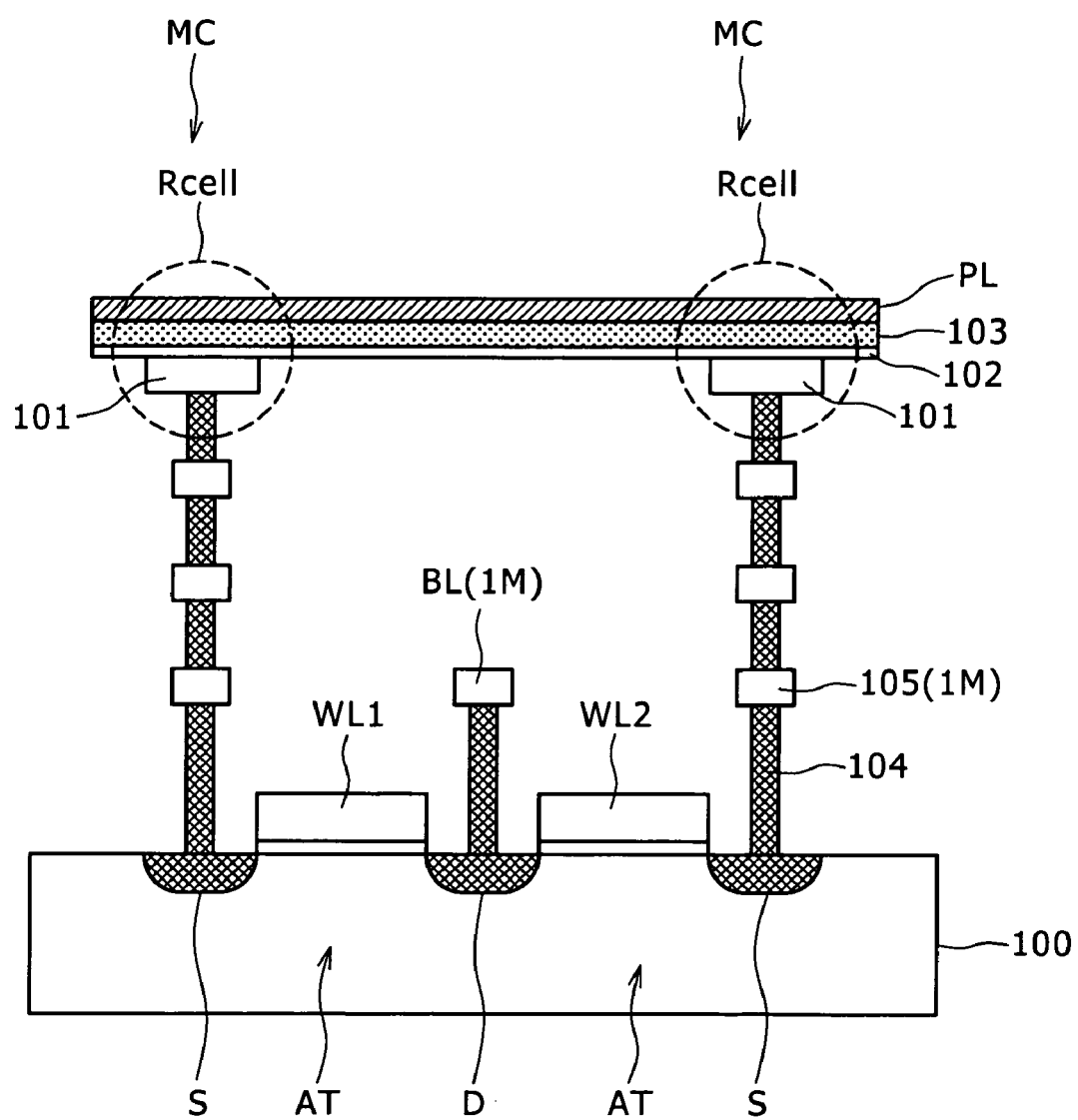
FIG. 2 is a diagram showing a cross section of the structure of a memory device for two memory cells adjacent to each other.

FIG. 2 is a diagram showing a cross section of two adjacent memory cells MC included in a variable-resistance semiconductor memory device. To be more specific, FIG. 2 is a diagram showing a cross section of a model which represents two adjacent memory cells MC and includes no hatched portions except the plate line PL. In particular, each of blank portions shown in FIG. 2 as portions including nothing is filled with an insulation film or used as another component (or a part of the other component).

In each of the memory cells MC shown in FIG. 2, the access transistor AT is created on a semiconductor substrate 100.

To put it in more detail, two impurity areas to be used as the source electrode S of the access transistor AT and the drain electrode D of the access transistor AT respectively are created on the semiconductor substrate 100. In a middle substrate area between the source electrode S and the drain electrode D, a gate electrode is created from a material such as polysilicon, being separated away from the middle substrate area by a gate insulation film. The two gate electrodes each created in the memory cell MC serve as word lines WL1 and WL2 respectively.

The two access transistors AT in the two memory cells MC respectively share the same drain D which is connected to a bit line BL created as a first-wire layer 1M.

On the source electrode S of the access transistor AT, a plug 104 and a landing pad 105 are heaped Up repeatedly to form a stack. The landing pad 105 is typically a wire layer. On the stack, a variable-resistance cell resistor Rcell is created. The number of pairs each including a plug 104 and a landing pad 105 heaped up in the stack on which a variable-resistance cell resistor Rcell is created is determined arbitrarily. Typically, the number of such pairs is four or five.

The variable-resistance cell resistor Rcell is created between a lower electrode 101 and an upper electrode which serves as the plate line PL. The variable-resistance cell resistor Rcell has a film configuration including an insulation film 102 connected to the lower electrode 101 and a semiconductor film 103 connected to the plate line PL.

Typical examples of a material used for making the insulation film 102 are $SiN$, $SiO_2$ and $Gd_2O_3$.

On the other hand, typical examples of a material used for making the semiconductor film 103 are a metallic film, an alloy film and a metallic compound film. The metallic film is typically a film containing one or more metallic elements such Cu, Ag and Zn. A typical example of the alloy film is an alloy film made of CuTe. It is to be noted that metallic elements other than Cu, Ag and Zn can also be used for making the semiconductor film 103 provided that each of the other metallic elements has a property allowing the metallic element to be ionized with ease. In addition, it is desirable to make use of at least one of S, Se and Te as an element to be combined with at least one of Cu, Ag and Zn. The semiconductor film 103 is created as a layer for supplying ions.

Figure 3A:
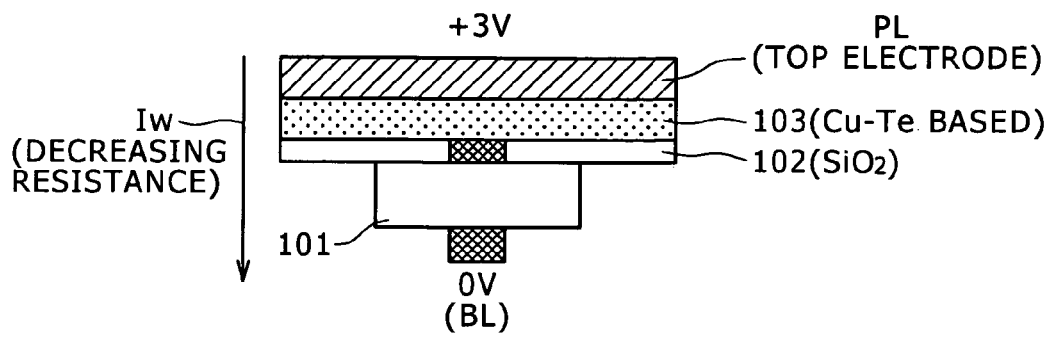
FIGS. 3A and 3B are a plurality of diagrams each showing an enlarged cross section of a variable-resistance cell resistor with a voltage applied to the resistor in a certain direction and a current flowing through the resistor in the certain direction.
Figure 3B:
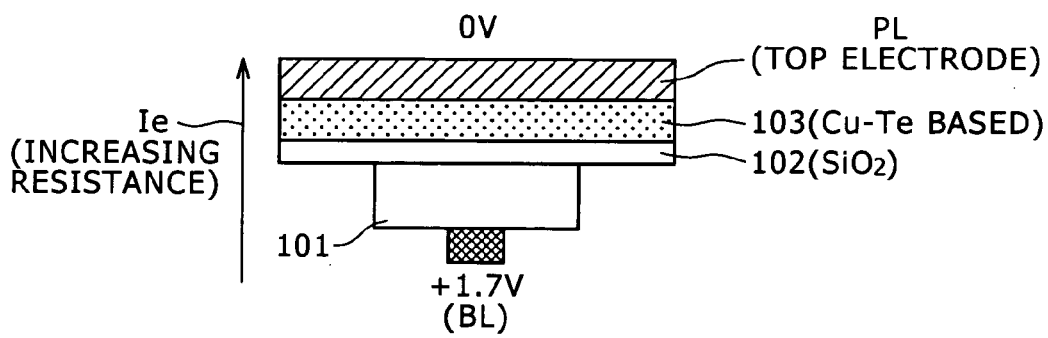

FIGS. 3A and 3B are a plurality of diagrams each showing an enlarged cross section of the variable-resistance cell resistor Rcell serving as a data storage element and showing the operation of the data storage element Rcell. To be more specific, FIG. 3A is a diagram showing the enlarged cross section of the data storage element Rcell which is making a transition to a small-resistance state and the operation of the data storage element Rcell. On the other hand, FIG. 3B is a diagram showing the enlarged cross section of the data storage element Rcell which is making a transition to a large-resistance state and the operation of the data storage element Rcell.

In each of the typical examples shown in FIGS. 3A and 3B, the insulation film 102 is created from $SiO_2$ whereas the semiconductor film 103 is made from a Cu—Te based alloy compound which is a compound based on a Cu—Te alloy.

In FIG. 3A, a voltage is applied between the lower electrode 101 and the upper electrode, which serves as the plate line PL, in such a direction that the insulation film 102 and the semiconductor film 103 are used as a cathode and an anode respectively. For example, the bit line BL linked to the lower electrode 101 wired to the insulation film 102 is connected to the ground GND having an electric potential of 0 V whereas the plate line PL linked to the semiconductor film 103 receives an electric potential of +3 V.

With the semiconductor film 103 and the lower electrode 101 set at electric potentials of +3 V and 0 V respectively as described above, the variable-resistance cell resistor Rcell exhibits a characteristic allowing Cu, Ag and/or Zn which are included in the semiconductor film 103 to be ionized and attracted by the insulation film 102 serving as the cathode. Thus, the conductive ions of these metals are injected into the insulation film 102. Accordingly, the insulating characteristic of the insulation film 102 deteriorates, bringing about a conductive characteristic to the insulation film 102. As a result, a write current Iw flows in a direction indicated by an arrow shown in FIG. 3A. This operation in which the write current Iw is flowing is referred to as a data write operation or a data set operation.

In a state shown in FIG. 3B, on the other hand, a voltage is applied between the lower electrode 101 and the upper electrode, which serves as the plate line PL, in such a direction that the insulation film 102 and the semiconductor film 103 are used as an anode and a cathode respectively. For example, the bit line BL receives an electric potential of +1.7 V whereas the plate line PL is connected to the ground GND having an electric potential of 0 V.

With the semiconductor film 103 and the lower electrode 101 set at electric potentials of 0 V and +1.7 V respectively as described above, ions injected into the insulation film 102 are returned to the semiconductor film 103 and the resistance of the variable-resistance cell resistor Rcell is reset to its original large value prevailing prior to the data write operation. In this state, an erase current Ie is flowing in a direction indicated by an arrow shown in FIG. 3B. This operation in which the erase current Ie is flowing is referred to as a data erase operation or a data reset operation.

It is to be noted that, in general, the data set operation is an operation to sufficiently inject conductive ions into the insulation film 102 in order to establish a set state whereas the data reset operation is an operation to sufficiently extract conductive ions from the insulation film 102 in order to establish a reset state.

On the other hand, it is possible to arbitrarily select a set or reset state as a written-data state or an erased-data state.

In the following description, the written-data state is defined as a set state which is established by decreasing the insulating characteristic of the insulation film 102 so as to reduce the resistance of the entire variable-resistance cell resistor Rcell to a sufficiently small value whereas, conversely, the erased-data state is defined as a reset state which is established by restoring the insulating characteristic of the insulation film 102 to its original level prevailing in the initial state so as to increase the resistance of the entire variable-resistance cell resistor Rcell to a sufficiently large value.

The directions of the arrows each indicating the direction of a current flowing through the variable-resistance cell resistor Rcell as shown in FIGS. 1A and 1B agree with the directions of the arrows each indicating the direction of a current flowing through the variable-resistance cell resistor Rcell as shown in FIGS. 3A and 3B. To put it more concretely, in the data set (or data write) operation carried out to establish the written-data state defined as the set state, the write current Iw is flowing from the plate line PL to the bit line BL. In the data reset (or data erase) operation carried out to establish the erased-data state defined as the reset state, the erase current Ie is flowing from the bit line BL to the plate line PL.

Figure 4:
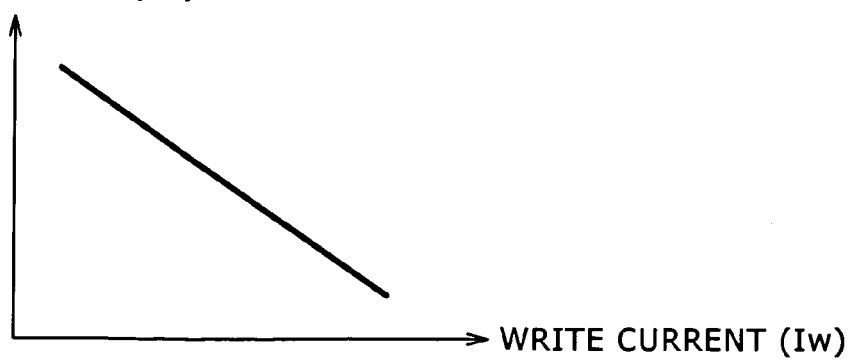
FIG. 4 is a diagram showing a characteristic representing the relation between the magnitude of a current flowing through a variable-resistance cell resistor and the resistance of the cell resistor.

FIG. 4 is a diagram showing a characteristic representing the relation between the magnitude of the write current Iw and the resistance of the variable-resistance cell resistor Rcell.

As shown in FIG. 4, the resistance of the entire variable-resistance cell resistor Rcell changes with the magnitude of the write current Iw. In the following description, the resistance of the entire variable-resistance cell resistor Rcell is also referred to simply as a cell resistance Rc. Since the cell resistance Rc changes with the magnitude of the write current Iw linearly to a certain degree, by controlling the write current Iw, the variable-resistance cell resistor Rcell can be used for storing a number of different values. For example, the variable-resistance cell resistor Rcell can be used for storing three or more different values.

By changing the resistance of the variable-resistance cell resistor Rcell from a small value to a large value or vice versa in a reversible manner, it is possible to establish the aforementioned set and reset states which can be associated with two stored values respectively. That is to say, the variable-resistance cell resistor Rcell can be used as a two-value data storage element. In addition, the set and reset states of exhibiting respectively the large and small cell resistances Rc representing respectively two different values of data stored in the memory cell MC are sustained even if a voltage applied to the variable-resistance cell resistor Rcell is removed. Thus, the memory cell MC functions as a nonvolatile memory.

It is to be noted that, in an actual data set operation, the resistance of the insulation film 102 changes in accordance with the number of metallic ions injected into the insulation film 102. Thus, the insulation film 102 can be regarded as an actual storage layer used for storing data.

A memory cell MC is constructed by utilizing a variable-resistance cell resistor Rcell, and a number of such memory cells MC are laid out to form a memory-cell matrix which is used as a core portion of a variable-resistance semiconductor memory device. In addition to the memory-cell matrix, the variable-resistance semiconductor memory device includes driving circuits which are each referred to as a peripheral circuit.

Direct Read-to-Verify Operation

The embodiment of the present invention adopts a method, in accordance with which residual electric charge, which remains on the bit line BL after a data update pulse is applied to the memory cell MC, is electrically discharged for a certain period of time through the memory cell MC and a change obtained as a result of the electrical discharge process is sensed as a voltage change. The data update pulse can be a data write pulse or a data erase pulse. In accordance with this method, a BL pre-charge process for a read-to-verify operation is not required. For this reason, in the following description, the read-to-verify operation is also referred to as a direct read-to-verify operation meaning a read-to-verify operation which can be carried out without the BL pre-charge process.

It is also possible to adopt an alternative method, in accordance with which, during a direct read-to-verify operation carried out after a data update pulse is applied to the memory cell MC, the electric charge of the plate line PL is electrically charged into the bit line BL for a certain period of time and a change obtained as a result of the electrical charge process is sensed as a voltage change. In addition, it is also possible to provide a configuration in which the change obtained as a result of the electrical discharge or charge process is sensed as a current change in place of a voltage change.

The variable-resistance memory device according to the embodiment has a driving control section for controlling the data update operation and the direct read-to-verify operation. In addition, the variable-resistance memory device also employs a sense amplifier which includes a data latch circuit. The sense amplifier senses and holds an electric potential which is given to a sense node (which is referred to as a first data holding node) of the sense amplifier from the bit line. The sense amplifier senses the electric potential given to the sense node by taking a reference electric potential, which is given to a reference node of the sense amplifier, as a comparison reference. The reference node of the sense amplifier is also referred to as a second data holding node of the sense amplifier.

The reference electric potential can be given to the reference node of the sense amplifier from a source external to the variable-resistance memory device or from a circuit inside the variable-resistance memory device. In addition, it is desirable to provide the driving control section inside the variable-resistance memory device. However, it is also possible to carry out the same control as that executed by the driving control section from a control section external to the variable-resistance memory device.

In addition, the driving control section ideally executes inhibit control by asserting a pulse voltage to be set next on the bit line properly for a case requiring application of an additional driving pulse and a case not requiring application of an additional driving pulse. Operations of the inhibit control are not carried out from a write/erase driver outside a memory-cell array section 1 through an LIO-line pair including a line LIO and a line /LIO. Instead, in the variable-resistance memory device according to the embodiment, the operations of the inhibit control are carried out in the memory-cell array section 1 by utilizing data stored in the sense amplifier which includes the data latch circuit as described above. A configuration for carrying out the operations of the inhibit control will be described later.

On top of that, when a pulse voltage is asserted on the bit line BL in a specific one of the data write and erase operations, the plate line PL is sustained at a certain electric potential. When a pulse voltage is asserted on the plate line PL in the other one of the data write and erase operations, on the other hand, the bit line BL is sustained at a certain electric potential. The variable-resistance memory device according to the embodiment adopts a technique, in accordance with which, after initial data has been set in the data latch circuit 71 of the sense amplifier 7 from the write/erase driver, the data held in the data latch circuit 71 is used in the memory-cell array section 1 repeatedly in a sequence of direct read-to-verify operations for a data write or erase operation. It is to be noted that control of the plate line PL is executed by a plate driver outside the memory-cell array section 1.

By referring to a chip block diagram, the following description explains an IC which serves as a typical implementation of the sense amplifier, the write/erase driver and the plate driver.

IC-Chip Configuration

Figure 5:
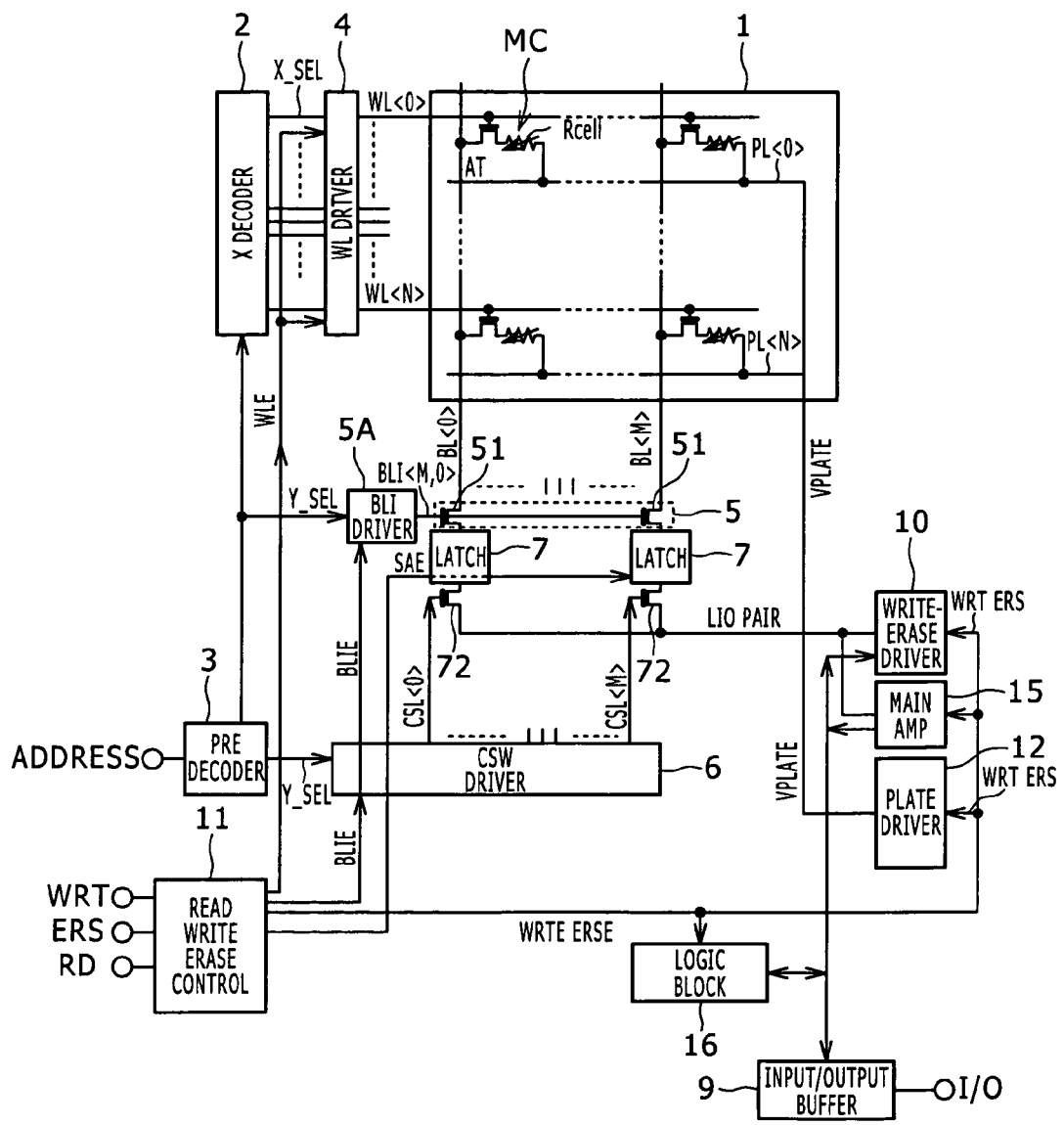
FIG. 5 is a block diagram showing an IC chip of a memory device employing memory cells in accordance with an embodiment of the present invention.

FIG. 5 is a block diagram showing the configuration of an IC chip of the variable-resistance semiconductor memory device.

The variable-resistance semiconductor memory device shown in FIG. 5 employs a memory-cell array section 1 and peripheral circuits of the memory-cell array section 1 which is mentioned above. The memory-cell array section 1 and the peripheral circuits are integrated to form the IC chip shown in FIG. 5. The memory-cell array section 1 is created as a matrix of memory cells MC shown in the diagrams of FIGS. 1 to 3. The memory-cell array section 1 has memory-cell rows and memory-cell columns. Each of the memory-cell rows has (M+1) memory cells MC laid out in the row direction whereas each of the memory-cell columns has (N+1) memory cells MC laid out in the column direction. Each of reference symbols M and N denotes a relatively large integer. The concrete value of M and N can be set arbitrarily.

As described above, each of the memory-cell rows of the memory-cell array section 1 has (M+1) memory cells MC laid out in the row direction. The gate electrodes of the access transistors AT each employed in one of the (M+1) memory cells MC are connected to the same word line WL oriented in the row direction. Thus, there are as many word lines WL as the memory-cell rows. The number of word lines WL or the number of rows is (N+1). In FIG. 5, the (N+1) word lines WL are denoted by reference notations WL<0> to WL<N> respectively. The word lines WL<0> to WL<N> each oriented in the row direction are laid out in the column direction at intervals determined in advance.

On the other hand, each of the memory-cell columns of the memory-cell array section 1 has (N+1) memory cells MC laid out in the column direction as described above. The drain electrodes of the access transistors AT each employed in one of the (N+1) memory cells MC are connected to the same bit line BL oriented in the column direction. Thus, there are as many bit lines BL as the memory-cell columns. The number of bit lines BL or the number of columns is (M+1). In FIG. 5, the M+1) bit lines BL are denoted by reference notations BL<0> to BL<M> respectively. The bit lines BL<0> to BL<M> each oriented in the column direction are laid out in the row direction at intervals determined in advance.

As described above, a specific one of the two ends of the variable-resistance cell resistor Rcell is connected to a plate line PL whereas the other one of the two ends of the variable-resistance cell resistor Rcell is connected to the source electrode of the access transistor AT. The specific ends of the variable-resistance cell resistors Rcell on any particular one of the memory-cell rows are connected to a common horizontal plate line PL associated with the particular memory-cell row. Thus, the memory-cell array section 1 has as many horizontal plate lines PL as the memory-cell rows. That is to say, the memory-cell array section 1 has (N+1) horizontal plate lines PL. The (N+1) horizontal plate lines PL each oriented in the row direction are laid out in the column direction at intervals determined in advance. Specific ends of the horizontal (N+1) plate lines PL are connected to each other by a common wire linked to a plate driver 12 which is provided at a location outside the memory-cell array section 1.

In addition, as an alternative, it is also possible to provide a configuration in which the specific ends of the variable-resistance cell resistors Rcell on any particular one of the memory-cell columns are connected a common vertical plate line PL associated with the particular memory-cell column. In this alternative configuration, the memory-cell array section 1 has as many plate vertical lines PL as the memory-cell columns. That is to say, the memory-cell array section 1 has (M+1)

vertical plate lines PL. The vertical (M+1) plate lines PL each oriented as a long wire in the column direction are laid out in the row direction at intervals determined in advance.

As shown in FIG. 5, the peripheral circuits include an X-address decoder 2, a pre-decoder 3 also functioning as a Y-address decoder, a WL (word line) driver 4, a BLI (bit-line isolation) switch 5 and a CSW (column switch) driver 6. In addition, the peripheral circuits also employ an SA (sense amplifier) 7 provided for each of the memory-cell columns and an I/O (input/output) buffer 9. In FIG. 5, the sense amplifier 7 is shown as a block denoted by notation Latch which means the data latch circuit explained before. On top of that, the peripheral circuits also have a write/erase driver 10, a control circuit 11 and the plate driver 12 cited above. Moreover, the peripheral circuits also include a main amplifier 15 and a logic block 16 for carrying out control operations such as an initial setting operation of the inhibit control. The main amplifier 15 is an amplifier for amplifying a signal output by the sense amplifier 7. Furthermore, the peripheral circuits also include a BLI driver 5A for controlling the BLI switch 5.

It is to be noted that the peripheral circuits also employ circuits not shown in FIG. 5. The circuits not shown in FIG. 5 include a circuit for generating a variety of voltages from a power-supply voltage and a circuit for controlling generation of a clock signal.

It is also worth noting that a signal output by the sense amplifier 7 is supplied to the write/erase driver 10 and the main amplifier 15 by way of NMOS transistors 72 which are used for controlling the connections of the sense amplifier 7 to the write/erase driver 10 and the main amplifier 15.

The X-address decoder 2 is configured to include a plurality of X selectors 20 which each serve as the basic unit of the X-address decoder 2. The X-address decoder 2 is a circuit for decoding an X-address signal received from the pre-decoder 3 and for supplying an X select signal X_SEL selected on the basis of a result of the decoding process to the WL driver 4. Not shown in FIG. 5, the X selector 20 will be described later in detail by referring to FIG. 6.

The pre-decoder 3 is a circuit for splitting an input address signal into an X address signal and a Y address signal. The pre-decoder 3 supplies the X address signal to the X-address decoder 2. On the other hand, a Y-address decode section employed in the pre-decoder 3 decodes the Y address signal.

The Y-address decode section employed in the pre-decoder 3 is configured to include a plurality of Y selectors 30 which each serve as the basic unit of the Y-address decode section. The Y-address decode section employed in the pre-decoder 3 is a circuit for decoding a Y-address signal obtained as a result of splitting the input address signal and for supplying a Y select signal Y_SEL selected on the basis of a result of the decoding process to the CSW driver 6. Not shown in FIG. 5, the Y selector 30 will be described later in detail by referring to FIG. 7.

The WL driver 4 is configured to include a plurality of (N+1) WL-driver units 4A which are each provided for a word line WL. To put it detail, the output node of each of the (N+1) WL-driver units 4A is connected to one of the (N+1) word lines WL<0> to WL<N>. That is to say, each specific one of the (N+1) word lines WL<0> to WL<N> is connected to the output node of a WL-driver unit 4A that is provided for the specific word line WL. The X select signal X_SEL received from the X-address decoder 2 is used for selecting one of the (N+1) WL-driver units 4A. The selected one of the (N+1) WL-driver units 4A applies a voltage determined in advance to a word line WL that is connected to the output node of the selected WL-driver unit 4A. Not shown in FIG. 5, the WL-driver unit 4A will be described later in detail by referring to FIG. 8.

The CSW driver 6 is configured to include a plurality of CSW-driver units 6A which each serve as the basic unit of the CSW driver 6. The CSW driver 6 is a circuit for controlling CSL (Column Select Lines) <0> to <M> in accordance with the Y select signal Y_SEL received from the pre-decoder 3 and a BLIE (Bit-Line Isolation Enable) signal received from the control circuit 11. Each CSL<M:0> controlled by the CSW driver 6 is connected to one of (M+1) NMOS transistors 72. Not shown in FIG. 5, the CSW-driver unit 6A will be described later in detail by referring to FIG. 9.

The BLI switch 5 is a group of switches 51 each configured to include only an NMOS transistor (or a PMOS transistor). As an alternative, the BLI switch 5 can also be a group of TGs (transmission gates) 51 created from an NMOS transistor and a PMOS transistor by connecting the source electrodes of the NMOS transistor and the PMOS transistor to each other and by connecting the drain electrodes of the NMOS transistor and the PMOS transistor to each other. Each of the switches (or the TGs) 51 included in the BLI switch 5 is used for connecting a sense amplifier 7 also serving as a data latch circuit to one of the bit lines BL. That is to say, the BLI switch 5 employs as many such switches (or TGs) 51 as the bit lines BL. To put it more concretely, the BLI switch 5 employs a total of (M+1) switches (or TGs).

The following description assumes that an NMOS transistor is employed to serve as a switch 51 of the BLI switch 5.

The BLI driver 5A is a circuit for generating signals BLI (Bit Line Isolation) <M:0>, which are each used for controlling one of the (M+1) NMOS transistors 51 employed in the BLI switch 5, in accordance with the Y select signal Y_SEL received from the pre-decoder 3 and the BLIE (Bit-Line Isolation Enable) signal received from the control circuit 11. The BLI driver 5A is configured to include (M+1) BLI driver units which each serve as the basic unit of the BLI driver 5A. Each of the BLI driver units not shown in FIG. 5 is used for controlling one of the (M+1) NMOS transistors 51. The BLI driver unit employed in the BLI driver 5A will be described in detail later by referring to FIG. 10.

The write/erase driver 10 is connected to the I/O buffer 9 which supplies input data coming from a source external to the variable-resistance semiconductor memory device to the write/erase driver 10. The write/erase driver 10 executes control to change data held in the sense amplifier 7 in accordance with the input data.

The output node of the sense amplifier 7 is connected to the input/output buffer 9 through the NMOS transistor 72 and the main amplifier 15. The sense amplifier 7 detects an electric-potential change appearing on the bit line BL through the NMOS transistor 51 and amplifies the electric-potential change. The sense amplifier 7 includes a data latch circuit for holding the amplified electric-potential change. The sense amplifier 7 is configured to also include a switch for controlling activation of the data latch circuit. In this configuration, the switch is controlled by an SAE (Sense Amplifier Enable) signal (and the inverted signal of the signal SAE) which are output by the control circuit 11 shown in FIG. 5. In addition, with the NMOS transistor 72 put in a turned-on state, the sense amplifier 7 also carries out an operation to output the data held in the data latch circuit to the main amplifier 15.

The control circuit 11 operates on the basis of three signals, i.e., an input write enable signal WRT, an input erase enable signal ERS and a data read signal RD which are supplied from external sources to the control circuit 11 as shown in FIG. 5.

The control circuit 11 has the following eight functions.

(1): A WL (word line) control function to supply a WL select enable signal WLE to WL driver units 4A employed in the WL driver 4.

(2): A function to control the BLI driver 5A through the pre-decoder 3 the CSW driver 6 or directly in order to put each of the NMOS transistors 51 in a turned-on or turned-off state.

(3): An operation-voltage generation control function to supply a write enable signal WRT to the write/erase driver 10 in a data write operation or an erase enable signal ERS to the write/erase driver 10 in a data erase operation.

(4): An operation-voltage generation control function to supply the write enable signal WRT to the plate driver 12 in a data write operation if necessary or the erase enable signal ERS to the plate driver 12 in a data erase operation if necessary.

(5): An SA (sense amplifier) activation/deactivation function to supply an SA enable signal SAE to the sense amplifier 7 in a direct read-to-verify operation and an activation function to supply a data read signal RD to the main amplifier 15.

(6): A function to control the logic block 16 in a direct read-to-verify operation in order to set initial data of the inhibit control.

(7): A function to generate other signals such as REC and /BLIRE to be described later by referring to FIGS. 10 and 11 respectively.

(8): A function to control select signals SEL_X0 to SEL_X10 to be described later by referring to FIG. 10.

A variety of control signals generated by the control circuit 11 are shown in FIG. 5 and are each denoted by making use of a notation assigned to a line conveying the control signal. It is to be noted that level changes of the control signals will be described later in detail.

Control-System Circuits

Figure 6:
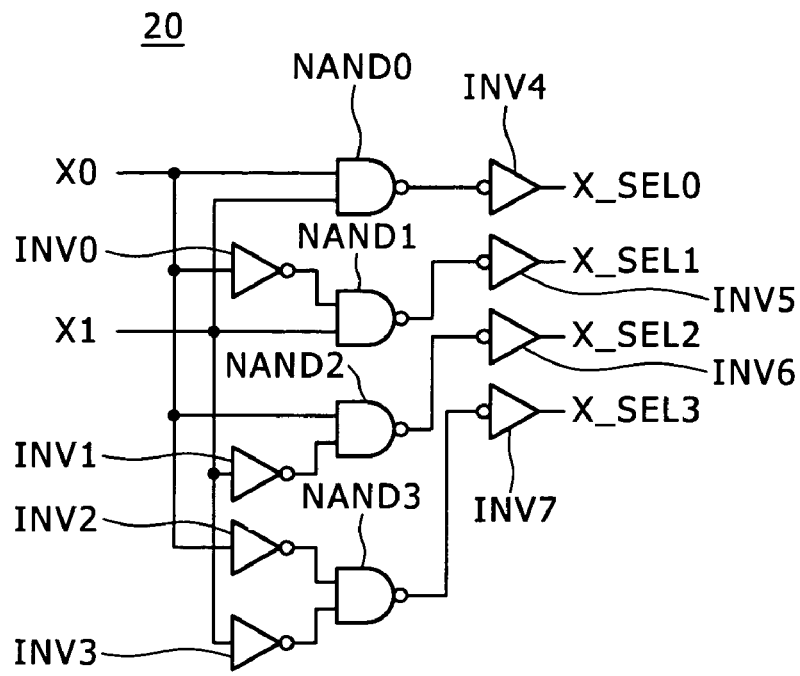
FIG. 6 is a diagram showing the circuit of an X selector employed in the memory device.
Figure 7:
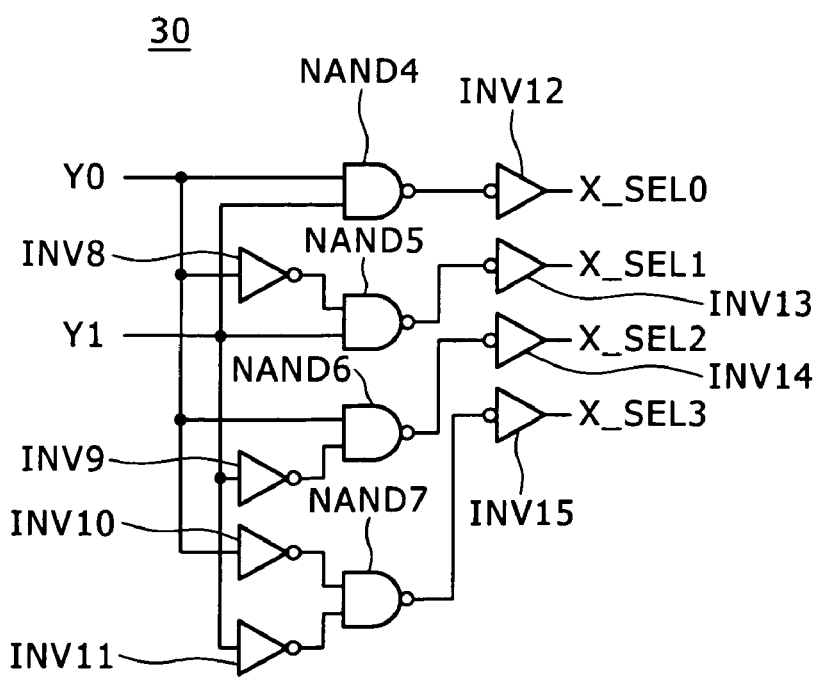
FIG. 7 is a diagram showing the circuit of a Y selector employed in the memory device.

Next, the following description explains the X selector 20 serving as the basic unit of the X-address decoder 2 by referring to FIG. 6 and explains the Y selector 30 serving as the basic unit of the Y-address decode section employed in the pre-decoder 3 by referring to FIG. 7. Then, the following description explains the WL-driver unit 4A serving as the basic unit of the WL driver 4 by referring to FIG. 8, the CSL driver unit 6A serving as the basic unit of the CSW driver 6 by referring to FIG. 9 and the BLI-driver unit serving as the basic unit of the BLI driver 5A by referring to FIG. 10.

FIG. 6 is a circuit diagram showing a typical circuit of the X selector 20.

The X selector 20 shown in FIG. 6 is configured to employ four inverters INV0 to INV3 provided at the front stage, four NAND circuits NAND0 to NAND3 provided at the middle stage and four other inverters INV4 to INV7 provided at the rear stage.

The X selector 20 receives X-address bits X0 and X1 from the pre-decoder 3, activating one of four X select signals X_SEL0 to X_SEL3 in a accordance with a result of decoding the X-address bits X0 and X1. Typically, the X selector 20 activates any particular one of the four X select signals X_SEL0 to X_SEL3 by setting the particular X select signal X_SEL at a high level.

The X selector 20 shown in FIG. 6 is a typical 2-bit decoder. In accordance with the number of input X-address bits X to be decoded, however, the configuration of the X selector 20 shown in FIG. 6 can be expanded or the number of stages composing the configuration can be increased so as to keep up with 3 or more input X-address bits X.

FIG. 7 is a circuit diagram showing a typical circuit of the Y selector 30.

The Y selector 30 shown in FIG. 7 is configured to employ four inverters INV8 to INV11 provided at the front stage, four NAND circuits NAND4 to NAND7 provided at the middle stage and four other inverters INV12 to INV15 provided at the rear stage.

The Y selector 30 receives Y-address bits Y0 and Y1, activating one of four Y select signals Y_SEL0 to Y_SEL3 in a accordance with a result of decoding the Y-address bits Y0 and Y1. Typically, the Y selector 30 activates any particular one of the four Y select signals Y_SEL0 to Y_SEL3 by setting the particular Y select signal Y_SEL at a high level.

The Y selector 30 shown in FIG. 7 is a typical 2-bit decoder. In accordance with the number of input Y-address bits Y to be decoded, however, the configuration of the Y selector 30 shown in FIG. 7 can be expanded or the number of stages composing the configuration can be increased so as to keep up with 3 or more input Y-address bits Y.

Figure 8:
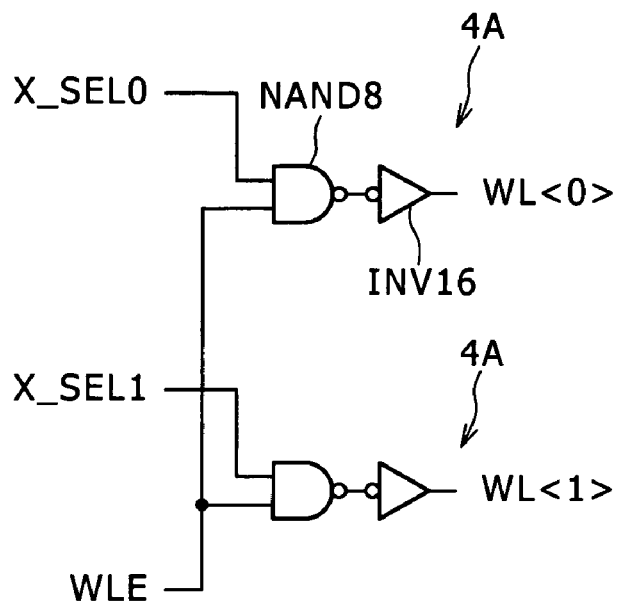
FIG. 8 is a diagram showing the circuit of a WL (Word Line) driver unit employed in the memory device to serve as a unit corresponding to two WLs.

FIG. 8 is a circuit diagram showing two adjacent WL-driver units 4A employed in the WL driver 4.

The WL driver 4 employs as many WL-driver units 4A each shown in FIG. 8 as the memory-cell rows of the memory-cell matrix or as memory cells MC provided on every column of the memory-cell matrix. As is obvious from the description given earlier, the number of memory-cell rows composing the memory-cell matrix or the number of memory cells MC provided on every column of the memory-cell matrix is (N+1).

Each of the (N+1) WL-driver units 4A is driven to operate by an X select signal X_SEL selected (or activated) by the X selector 20 shown in FIG. 6. In the case of the configuration shown in FIG. 8, the two WL-driver units 4A are driven to operate by the X select signals X_SEL0 and X_SEL1 respectively. The WL-driver unit 4A driven by the X select signal X_SEL0 or X_SEL1 activates the word line WL<0> or WL<1> respectively.

As shown in FIG. 8, each WL-driver unit 4A is configured to employ a NAND circuit and an inverter. In the case of the configuration shown in FIG. 8, the upper WL-driver unit 4A is configured to employ a NAND circuit NAND8 and an inverter INV16.

One of the input nodes of the NAND circuit receives a WL select enable signal WLE whereas the other input node of the NAND circuit receives the X select signal X_SEL0 or X_SEL1 selected (or activated) by the X selector 20 shown in FIG. 6. In the case of the upper WL-driver unit 4A included in the configuration shown in FIG. 8, the other input node of the NAND circuit NAND8 receives the X select signal X_SEL0. The output node of the NAND circuit NAND8 is connected to the input node of the inverter INV16. The output node of the inverter INV is connected to a word line WL<0> or WL<1>. In the case of the upper WL-driver unit 4A included in the configuration shown in FIG. 8, the output node of the inverter INV16 is connected to the word line WL<0>. A signal output by the inverter INV puts the word line WL connected to the inverter INV in an active or inactive state.

The WL select enable signal WLE shown in FIG. 8 is generated by the control circuit 11 shown in FIG. 5 and supplied to the WL driver 4.

Figure 9:
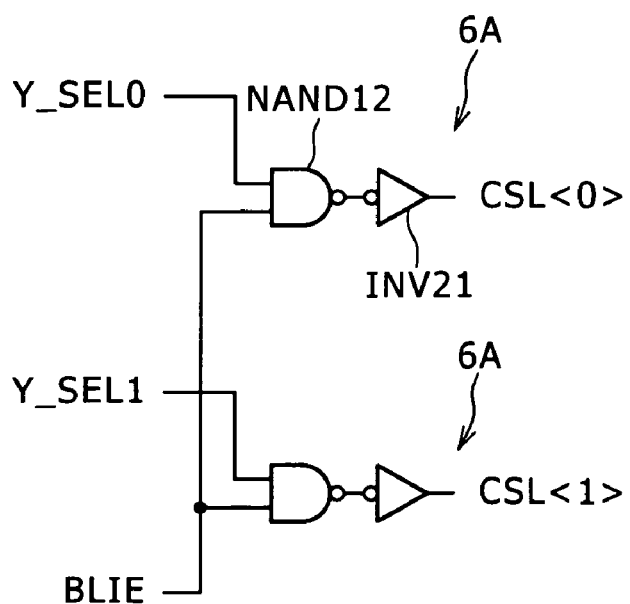
FIG. 9 is a diagram showing the circuit of a CSL (Column Select Line) driver unit employed in the memory device to serve as a unit corresponding to two CSLs.

FIG. 9 is a circuit diagram showing two adjacent CSL-driver units 6A employed in the CSL driver 6.

As shown in FIG. 9, each CSL-driver unit 6A is configured to employ a NAND circuit and an inverter. In the case of the configuration shown in FIG. 9, the upper CSL-driver unit 6A is configured to employ a NAND circuit. NAND12 and an inverter INV21. The output node of the NAND circuit NAND12 is connected to input node of the inverter INV21.

One of the input nodes of the NAND circuit receives a BLI enable signal BLIE whereas the other input node of the NAND circuit receives the Y select signal Y_SEL0 or X_SEL1 selected (or activated) by the Y selector 30 shown in FIG. 7. In the case of the upper CSL-driver unit 6A included in the configuration shown in FIG. 9, the other input node of the NAND circuit NAND12 receives the Y select signal Y_SEL0. If both the BLI enable signal BLIE and the Y select signal Y_SEL are set at a high level of an active state, the signal output by the NAND circuit NAND is put at the low level. Thus, the column select signal CSL<0> or CSL<1> is set at the high level of an active state in the case of this embodiment. In the case of the upper CSL-driver unit 6A included in the configuration shown in FIG. 9, if both the BLI enable signal BLIE and the Y select signal Y_SEL0 are set at a high level of an active state, the signal output by the NAND circuit NAND12 is put at the low level. Thus, the column select signal CSL<0> is set at the high level of an active state in the case of this embodiment.

The column select signals CSL<0>, CSL<1> and so on are denoted by reference symbols CSL <0> to CSL <M> in FIG. 5 and each supplied to the gate electrode of one of the NMOS transistors 72.

The BLI enable signal BLIE shown in FIG. 9 is generated by the control circuit 11 shown in FIG. 5 and supplied to the CSW driver 6.

It is to be noted that a detailed typical circuit of the BLI driver 5A which is one of the column control system circuits is described by referring to FIG. 10 in the following explanation of a column circuit configuration.

Column Circuit Configuration

Figure 10:
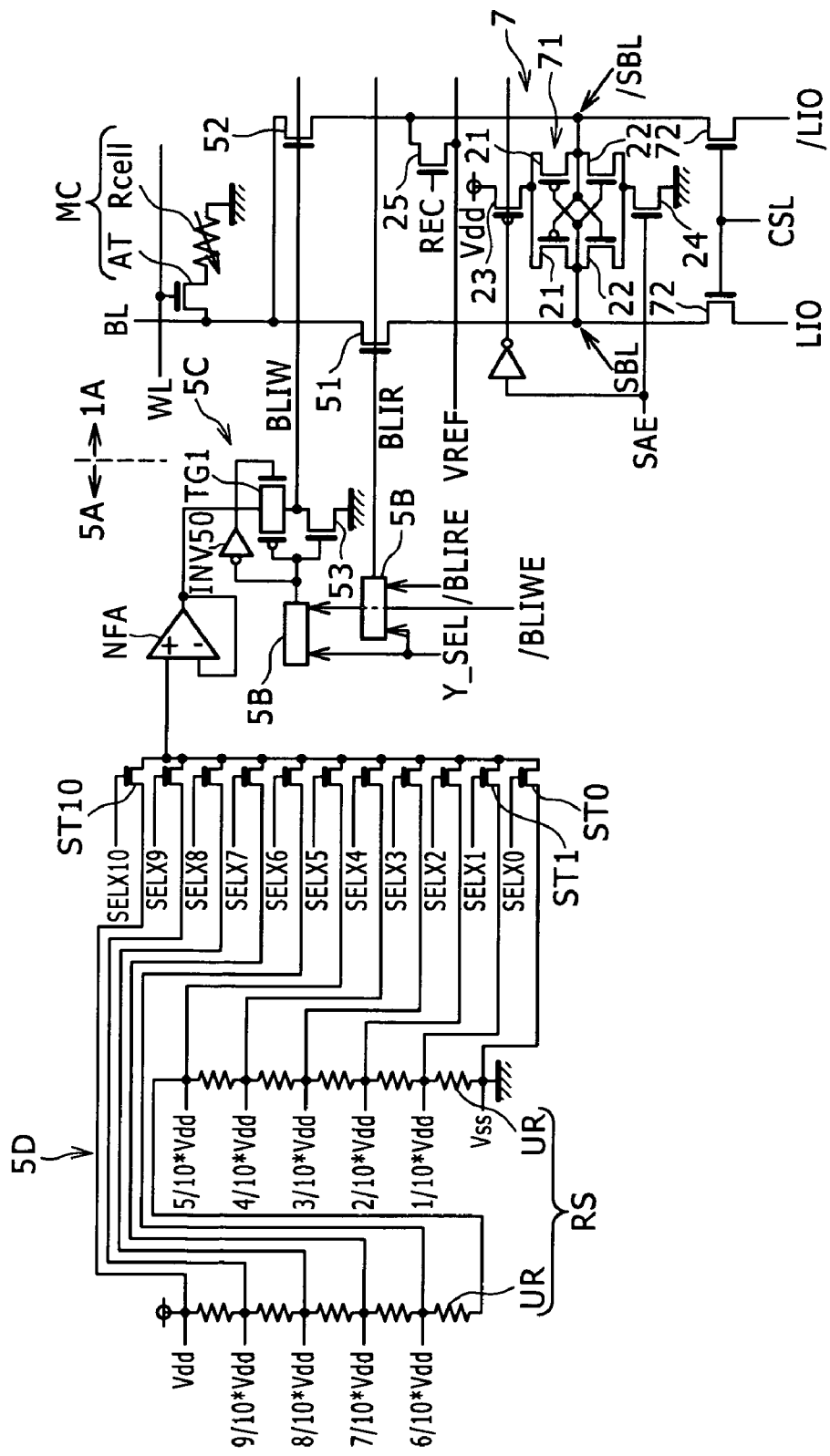
FIG. 10 is a circuit diagram showing the configurations of a memory-cell column and a BLI (Bit Line Isolation) driver which are provided in accordance with a first embodiment of the present invention.

FIG. 10 is a circuit diagram roughly showing typical configurations of a memory-cell column and the BLI driver 5A which are provided in accordance with a first embodiment of the present invention.

The technical term 'column circuit configuration' used in the specification of the present invention means a bit line connected to a memory cell MC serving as the subject of a data read operation and peripheral circuits each connected to the bit line to serve as a circuit which is involved in the data read operation. In other words, the column circuit configuration also referred to simply as a column circuit is a basic configuration including a memory cell MC employed in the memory-cell array section 1, the BLI driver 5A and the sense amplifier 7. As explained above, the IC shown in FIG. 5 employs the memory-cell array section 1, the WL driver 4, the BLI driver 5A, the CSW driver 6, the write/erase driver 10, the plate driver 12, the X decoder 2, the pre-decoder 3, the input/output buffer 9, the control circuit 11, the main amplifier 15 and the logic block 16.

On the other hand, a driving control section is a section for controlling the direct read-to-verify operation. Thus, the driving control section can be regarded as a section obtained by removing the memory cell MC of the memory-cell array section 1 from the configurations shown in FIG. 10 and by adding sections including the control circuit 11 and the logic block 16 which are shown in FIG. 5. However, the driving control section can be defined as a section which is different from the section obtained as described above. For example, the driving control section may include a circuit for generating a voltage and a signal which are used for controlling the column circuit configuration also referred to simply as the column circuit as described above.

The column circuit according to the first embodiment employs a sense amplifier 7 of the flip-flop type. The flip-flop sense amplifier 7 carries out an operation to sense the BL electric potential. The sense amplifier 7 is connected to an SBL (Sense Bit Line) pair including lines SBL and /SBL (inverted Sense Bit Line) and also connected to an LIO (Local Input Output) line pair including a line LIO and a line /LIO (inverted Local Input Output).

The basic configuration of the sense amplifier 7 includes the data latch circuit 71 also referred to as a sense latch 71 for sensing a difference in electric potential between the lines SBL and /SBL, which compose the SBL pair, and amplifying the difference in electric potential. The data latch circuit 71 itself can have any configuration provided that the configuration is capable of storing the amplified difference in electric potential as two pieces of mutually complementary data. The two outputs of the sense amplifier 7 are connected to two NMOS transistors 72 respectively. The two NMOS transistors 72 are transistors for controlling connections of the data latch circuit 71 to the LIO (Local Input Output) line pair including lines LIO and /LIO. In the following description, the LIO (Local Input Output) line pair including a line LIO and a line /LIO is referred to simply as an LIO line pair.

The data latch circuit 71 employs two inverters. The output of a specific one of the two inverters is connected to the input of the other one of the two inverters. On the other hand, the input of the specific inverter is connected to the output of the other inverter. Each of the inverters employs a PMOS transistor 21 and an NMOS transistor 22.

The two PMOS transistors 21 share a common source electrode. A PMOS transistor 23 is connected between the common source electrode shared by the two PMOS transistors 21 and a power-supply voltage line. The PMOS transistor 23 is a transistor controlled by a low-active inverted SAE (Sense Amplifier Enable) signal /SAE. By the same token, the two NMOS transistors 22 share a common source electrode. A NMOS transistor 24 is connected between the common source electrode shared by the two NMOS transistors 22 and the ground line. The NMOS transistor 24 is a transistor controlled by a high-active SAE signal SAE. In the typical configurations shown in FIG. 10, the low-active inverted SAE signal /SAE is obtained through inversion of the high-active SAE signal SAE by an inverter.

A specific one of the two NMOS transistors 72 is connected between the sense bit line SBL and the local input/output line LIO whereas the other one of the two NMOS transistors 72 is connected between the inverted sense bit line /SBL and the inverted local input/output line /LIO.

Each of the two NMOS transistors 72 is controlled by an electric potential appearing on the column select line CSL to enter a turned-on or turned-off state. The electric potential appearing on the column select line CSL is an electric potential generated by the CSW driver 6 shown in FIG. 5.

The specific NMOS transistor 72 is used for reading out the data sensed, amplified and held in the data latch circuit 71 and for transferring the data to the local input/output line LIO of the LIO line pair. On the other hand, the other NMOS transistor 72 is used for reading out the data sensed, amplified and held in the data latch circuit 71 and for transferring the data to the inverted local input/output line /LIO of the LIO line pair. In addition, the specific NMOS transistor 72 is used for forcibly transferring initial data from the local input/output line LIO of the LIO line pair to the data latch circuit 71 whereas the other NMOS transistor 72 is used for forcibly transferring the initial data from the inverted local input/output line /LIO of the LIO line pair to the data latch circuit 71 in a data update operation which is carried out by the write/erase driver 10 shown in FIG. 5.

A sense node of the sense amplifier 7 shown in FIG. 10 is connected to the sense bit line SBL whereas a reference node of the sense amplifier 7 is connected to the inverted sense bit line /SBL. The sense and reference nodes of the sense amplifier 7 are referred to as respectively a first data holding node of the data latch circuit 71 and a second data holding node of the data latch circuit 71.

The NMOS transistor 51 also shown in FIG. 5 is connected between the sense bit line SBL and the bit line BL as shown in FIG. 10. In addition, an NMOS transistor 52 not shown in FIG. 5 is connected between the inverted sense bit line /SBL and the bit line BL as shown in FIG. 10. The NMOS transistor 52 is a transistor serving as a BLI switch element which is also referred to as the second switch (52).

The NMOS transistor 51 and the NMOS transistor 52 correspond to as respectively first and second switches provided by the embodiment of the present invention. In the following description, the NMOS transistor 51 and the NMOS transistor 52 are also referred to as the first switch (51) and the second switch (52) respectively.

A reference electric potential VREF is applied to the inverted sense bit line /SBL by way of an NMOS transistor 25. The NMOS transistor 25 is controlled by a reference control signal REC which is supplied to the gate electrode of the NMOS transistor 25 by the control circuit 11 shown in FIG. 5.

The following description begins with explanation of a portion included in the BLI driver 5A shown in FIG. 10 to serve as a portion for controlling the first switch (51). As shown in the figure, the gate electrode of the first switch (51) is connected to a BLI select circuit 5B.

Figure 11:
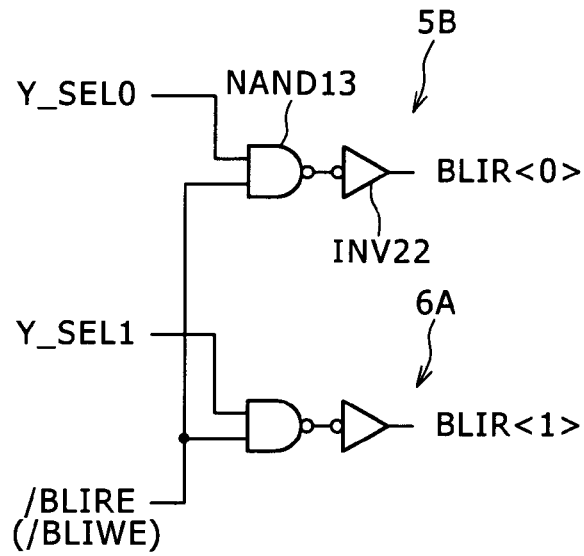
FIG. 11 is a diagram showing a BLI select circuit.

FIG. 11 is a diagram showing a typical BLI select circuit 5B for generating two signals to be supplied to two memory-cell rows respectively.

As shown in FIG. 11, the basic configuration of the BLI select circuit 5B has a NAND gate NAND13 and an inverter INV22 connected to the output node of the NAND gate NAND13.

A BLI read enable signal /BLIRE generated by the control circuit 11 shown in FIG. 5 is supplied to a specific one of the two input nodes of the NAND gate NAND13 whereas a Y select signal Y_SEL0 or Y_SEL1 activated by the Y selector 30 shown in FIG. 7 is supplied to the other one of the two input nodes of the NAND gate NAND13. When both the BLI read enable signal /BLIRE and the Y select signal Y_SEL0 or Y_SEL1 are set at a high level indicating the activated state in the case of the first embodiment, a signal output by the NAND gate NAND13 is set at the 0 level. With the output signal of the NAND gate NAND13 set at the 0 level, a BL isolation read signal BLIR <0> or BLIR <1> output by the inverter INV22 is set at a high level indicating the activated state in the case of the first embodiment.

As shown in FIG. 5 and FIG. 10, the BL isolation read signal BLIR <0> or BLIR <1> is supplied to the gate electrode of the first switch (51) which is associated with the BL isolation read signal BLIR <0> or BLIR <1>.

It is to be noted that the BLI read enable signal /BLIRE shown in FIG. 11 is generated by the control circuit 11 shown in FIG. 5 as described above and supplied to the BLI select circuit 5B employed in the BLI driver 5A to serve as a circuit for controlling the first switch (51).

The reader is requested to refer back to FIG. 10. As shown in the figure, the BLI select circuit 5B having the same configuration as that shown in FIG. 11 is also provided on a side for controlling the second switch (52). On this side, however, a voltage changeover switch 50 is provided between the BLI select circuit 5B and the gate electrode of the second switch (52). In addition, also on this side, a voltage generation circuit 5D and a negative feedback amplifier NFA are provided. The voltage generation circuit 5D and the negative feedback amplifier NFA are circuits for controlling a positive power supply of the voltage changeover switch 5C. The voltage changeover switch 5C, the voltage generation circuit 5D and the negative feedback amplifier NFA form an embodiment implementing a voltage generation control section.

It is to be noted that, as shown in FIGS. 10 and 11, the BLI select circuit 5B for controlling the second switch (52) receives a BLI write enable signal /BLIWE in place of the BLI read enable signal /BLIRE. In the case of the BLI select circuit 5B for controlling the second switch (52), a signal output by the inverter INV22 shown in FIG. 11 is supplied to the voltage changeover switch 5C which outputs a BL isolation write signal BLIW to the gate electrode of the NMOS transistor 52 serving as the second switch (52) shown in FIG. 10. The BL isolation write signal BLIW represents BL isolation write signals BLIW<0>, BLIW<1> and so on which are each generated for a memory-cell row of the memory-cell array section 1.

As shown in FIG. 10, the voltage generation circuit 5D employs a resistor string RS provided between a line for providing a power-supply voltage Vdd and a line for providing the GND voltage in addition to a number of select transistors ST0 to ST10.

For example, the resistor string RS has ten unit resistors UR which are connected to each other in series to form a resistor circuit. Every two adjacent unit resistors UR are connected to each other by an inter-resistor node. Thus, the resistor string RS has a total of nine inter-resistor nodes which are connected to the drain electrodes of nine aforementioned select transistors ST1 to ST9 respectively. In addition, a resistor-string node wired to the line for providing the power-supply voltage Vdd is connected to the drain electrode of the select transistor ST10 whereas a resistor-string node wired to the ground GND is connected to the drain electrode of the select transistor ST0. The source electrodes of the eleven select transistors ST0 to ST10 are wired to each other by a common line which is connected to the non-inverting input node '+' of the negative feedback amplifier NFA. The output node of the negative feedback amplifier NFA is connected to the inverting input node '−' of the negative feedback amplifier NFA through a feedback path and also connected to the voltage changeover switch 5C. The negative feedback amplifier NFA serves as a positive power supply for supplying a voltage to the voltage changeover switch 5C.

As shown in FIG. 10, the voltage changeover switch 5C employs an inverter INV50, a transfer gate circuit TG1 and an NMOS transistor 53.

The inverter INV50 is a component for inverting a signal output by the BLI select circuit 5B and supplying a signal obtained as a result of the inversion to the gate electrode of an NMOS transistor employed in the transfer gate circuit TG1. The gate electrode of a PMOS transistor employed in the transfer gate circuit TG1 is connected to the input node of the inverter INV50.

The transfer gate circuit TG1 is connected between the output node of the negative feedback amplifier NFA and the NMOS transistor 53. The source or drain electrode of the NMOS transistor 53 is connected to the ground GND. The source or drain electrode connected to the ground GND is the electrode on a side opposite to the transfer gate circuit TG1. The source or drain electrode on the same side as the transfer gate circuit TG1 is connected to the transfer gate circuit TG1. The gate electrode of the NMOS transistor 53 is connected to the output node of the BLI select circuit 5B.

The NMOS transistor 53 is a reset element which is put in a turned-on state in order to reset the BL isolation write signal BLIW at the electric potential of the ground GND when the transfer gate circuit TG1 is in a turned-off state.

Next, operations carried out by the column circuit shown in FIG. 10 are explained below. Before the operations are explained, typical comparison configurations not according to an embodiment of the present invention are described. The typical comparison configurations are compared with the column circuit shown in FIG. 10. It is to be noted that, in the following description, Patent Document 2 is referred to as a document explaining a variable-resistance memory device which is capable of executing control approximately equivalent to that of the typical comparison configurations.

Typical Comparison Configurations

Figure 12:
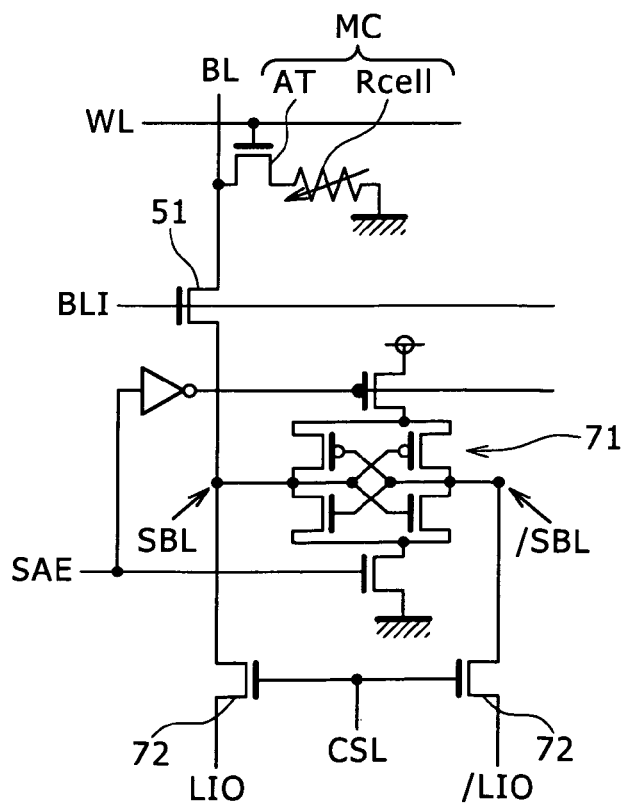
FIG. 12 is a diagram showing a column configuration of a typical memory device to be compared with the column configuration according to the first embodiment.

FIG. 12 is a diagram showing a column configuration of a typical memory device not according to an embodiment of the present invention to be compared with the column configuration shown in FIG. 10 as the column configuration according to the first embodiment of the present invention.

In comparison with the column configuration shown in FIG. 10, the column configuration shown in FIG. 12 does not employ the BLI driver 5A, the second switch (52) and the NMOS transistor 25. However, the NMOS transistor 25 is already known as a switch element to apply a reference voltage to the reference node of a sense amplifier described in Patent Document 2. The first switch (51) shown in FIG. 12 is described also in Patent Document 1. NMOS transistors 72 employed in the column configuration shown in FIG. 12 are not described in Patent Document 2, but this column configuration is a general configuration. An essential difference between the column configuration shown in FIG. 12 and the column configuration shown in FIG. 10 is the fact that the column configuration shown in FIG. 12 does not employ the BLI driver 5A.

In the following description, a read-to-verify operation carried out after a data erase operation is assumed. By properly reversing the direction of biases and relations between electric potentials and by parity of reasoning, however, the following description can also be applied to a direct read-to-verify operation carried out after data write operation.

In accordance with Patent Document 2, as a result of switch control, an erase voltage is applied to the bit line BL. To put it more concretely, the NMOS transistors 72 are turned in order to supply initial erase data from the LIO line pair including the local input/output line LIO and the inverted local input/output line /LIO to the data latch circuit 71. The initial erase data results in "SBL=H and /SBL=L" which means that the sense bit line SBL is set at a high level whereas the inverted sense bit line /SBL is set at a low level. The initial erase data of "SBL=H and /SBL=L" is held in the data latch circuit 71. Then, an electric potential representing the initial erase data of "SBL=H" is passed on as a data erase pulse from the sense bit line SBL to the bit line BL by way of the first switch (51) which has been put in a turned-on state.

When the H-level data erase pulse reaches the bit line BL, an erase current Ie flows to the memory cell MC, increasing the resistance of the variable-resistance cell resistor Rcell employed in the memory cell MC in a data erase operation.

Then, the first switch (51) is put in a turned-off state in order to discontinue the application of the data erase pulse to the bit line BL. When the application of the data erase pulse to the bit line BL is terminated, a voltage appearing on the bit line BL to serve as a bias causes a read current to flow to the memory cell MC. After power has been supplied from a power supply to the data latch circuit 71, the first switch (51) is again put in a turned-on state. With the first switch (51) again put in a turned-on state, a bit-line electric potential according to a resistance change of the variable-resistance cell resistor Rcell is read out by the data latch circuit 71 in a read-to-verify operation carried out after the data erase operation. In the following description, the bit-line electric potential meaning an electric potential appearing on the bit line BL is referred to simply as a BL electric potential.

During the read-to-verify operation, the bit line BL is electrically discharged from the H level to the GND level through the variable-resistance cell resistor Rcell. If the resistance of the variable-resistance cell resistor Rcell was not increased to a sufficiently high value during the data erase operation leading ahead of the read-to-verify operation, the BL electric potential is decreased from the H level to an L level by the electrical discharge process. The fact that the resistance of the variable-resistance cell resistor Rcell was not increased to a sufficiently high value during the data erase operation leading ahead of the read-to-verify operation indicates that the data erase operation has ended up in failure.

If the data erase operation is carried out successfully, on the other hand, the resistance of the variable-resistance cell resistor Rcell is increased to a sufficiently high value set in the initial state. Thus, during the read-to-verify operation, the bit line BL is hardly discharged from the H level to the GND level through the variable-resistance cell resistor Rcell, and the BL electric potential is therefore sustained at the H level as it is.

If a data erase operation ends up in failure, it is necessary to carry out the data erase operation once more.

Figure 13A:
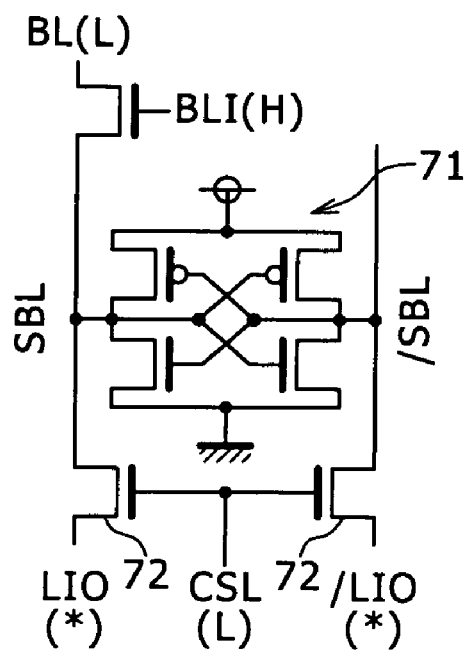
FIGS. 13A and 13B are a plurality of diagrams showing the circuit of the column configuration of the typical memory device and the levels of electric potentials generated in the column configuration in the case of an erase failure.
Figure 13B:
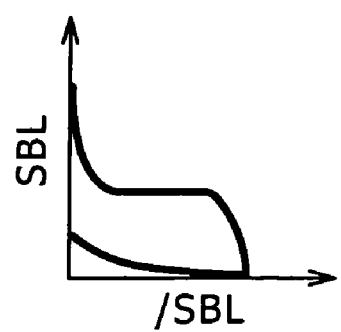

FIGS. 13A and 13B are a plurality of diagrams showing the circuit of the column configuration of the typical memory device described above and the levels of electric potentials generated on the sense bit line. SBL and the inverted sense bit line /SBL in the column configuration in the case of an erase failure.

To be more specific, FIG. 13A is a diagram showing the circuit of the column configuration of the typical memory device whereas FIG. 13B is a diagram showing the electric-potential levels in the case of an erase failure.

In order to reapply the erase voltage (that is, the data erase pulse) to the memory cell MC, it is necessary to set the BL electric potential at the H level. After the read-to-verify operation has been carried out, however, the BL electric potential generally changes to the L level. A state in which the BL electric potential has been changed to the L level is equivalent to a write state in an SRAM. In such a state, both the electric potential appearing on the sense bit line SBL and the electric potential appearing on the inverted sense bit line /SBL are set at the L level, undesirably giving rise to an instable condition of data latched in the data latch circuit 71 in some cases.

By the way, in order to obtain a high update transfer rate, it is possible to presumably provide a configuration in which a plurality of circuits shown in FIG. 12 are connected to each other in parallel. In such a configuration, it is desirable to drive the bit line BL by making use of only the data latch circuit 71 without making an access of the local I/O line pair which includes a local input/output line LIO and an inverted local input/output line /LIO. That is to say, it is necessary to change the BL electric potential from the L level to the H level on the basis of data latched in the data latch circuit 71.

In the case of a data erase operation ending up in failure, however, data latched in the data latch circuit 71 is inevitably destroyed and undesirably put in an unstable state so that, with such an unstable state unchanged as it is, a voltage (that is, a data erase pulse) cannot be applied to the bit line BL in execution of an additional data erase operation.

Next, a successful data erase operation is explained as follows.

With a timing to apply an additional erase pulse to a memory-cell column experiencing a failure of a data erase operation, it is necessary to set the BL electric potential of a memory-cell column experiencing a successful data erase operation at the L level prior to execution of an erase-inhibit setting operation which is free of data erase disturbances.

FIG. 14A is a diagram showing the typical comparison circuit, FIG. 14B1 shows the timing chart of a signal appearing on a WL (Word Line), FIG. 14B2 shows the timing chart of a signal appearing on a BL (Bit Line) and FIG. 14B3 shows the timing chart of a signal BLI (Bit Line Isolation).

As described above, in order to meet a demand for a high update transfer rate, it is necessary to carry out an operation to drive the bit line BL with the data latch circuit 71 holding initial erase data as shown in FIG. 14A.

If a data erase operation has ended up in failure, in a read-to-verify operation carried out after the unsuccessful data erase operation, as shown in FIG. 14B, the bit line BL is electrically discharged so that the BL electric potential decreases and data latched in the data latch circuit 71 may enter an unstable state in some cases as described above. However, it is assumed here that the initial erase data is sustained as shown in FIG. 14A.

In this case, if the BL isolation signal BLI is set at the H level at a drive start point Td shown by FIG. 14B3, with initial erase data held in the data latch circuit 71 as it is, the bit line BL can be electrically charged in order to raise the BL electric potential to the H level.

If a data erase operation has been carried out successfully, on the other hand, the BL electric potential is hardly lowered during the read-to-verify operation carried out after the data erase operation as shown by FIG. 14B2. Thus, in the BL drive starting at the drive start point Td, it is necessary to set the BL electric potential at the L level in order to establish an erase inhibit state.

For the reason described above, in order to establish an erase inhibit state, the transfer inverter 95 is put in a turned-on state so as to carry out control to forcibly lower the BL electric potential to the L level by the drive power of the transfer inverter 95.

Since the control to put the transfer inverter 95 in a turned-on state only for a memory-cell column experiencing a successful data erase operation is not self-contained control, however, the column configuration must include a data latch circuit for latching data in the case of a successful data erase operation and another data latch circuit for latching data in the case of a data erase operation ending up in failure. Thus, the column configuration becomes complicated. On the other hand, an effort made to prevent the column configuration from becoming complicated constitutes a contradiction with the fact that the column concurrent operations to attain a high update transfer rate becomes difficult to carry out because, for example, the logic block 16 shown in FIG. 5 needs to read out the result of the read-to-verify operation and execute reversed control.

Figure 15A:
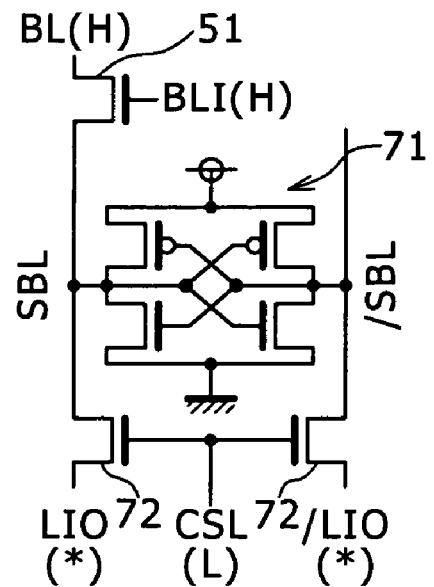
FIGS. 15A and 15B are a plurality of diagrams showing a typical comparison circuit for pulling up a BL electric potential and the levels of electric potentials generated in the typical comparison circuit.
Figure 15B:
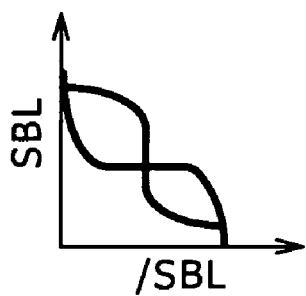

As a countermeasure to be taken to solve the problem described above, as shown in FIGS. 15A and 15B, it is possible to conceive a method for pulling up the BL electric potential in advance to the H level in the same way as the read state of an SRAM. By the way, FIGS. 15A and 15B are a plurality of diagrams showing a typical comparison circuit for pulling up the electric potential and the levels of electric potentials generated in the typical comparison circuit. To be more specific, FIG. 15A is a diagram showing the typical comparison circuit whereas FIG. 15B is a diagram showing the levels of electric potentials generated on the sense bit line SBL and the inverted sense bit line /SBL in the typical comparison circuit.

By adoption of this method, in the event of a data erase operation ending up in failure, the voltage of the data erase pulse can be set by pulling up the BL electric potential to the H level (BL=H) without destroying the state of data latched in the data latch circuit 71. In addition, in the event of a successful data erase operation, an inhibit-state BL voltage can be applied to the bit line BL (BL=L) without destroying the state of data latched in the data latch circuit 71.

In the event of a successful data erase operation, however, it is necessary to carry out a sequence of operations to once pull up the BL electric potential to the H level from the L level (BL=L), which has been obtained as a result of a read operation carried out as a part of the read-to-verify operation, before an inhibit-state BL voltage is applied to the bit line BL (BL=L) as described above in order to establish the erase inhibit state. Thus, the operations become complicated. In addition, when the data latch circuit 71 drives the bit line BL to change the BL electric potential from the H level to the L level, it is feared that an unselected memory cell MC connected to the same word line WL as the memory cell MC in question is affected by disturbances tending to erase data from the unselected memory cell MC while the BL electric potential is making a transition from the H level to the L level.

Some improvements for the typical comparison circuits described above can be summarized as follows.

In the first place, in order to drive the bit line BL by an electric potential held in the data latch circuit without relying on the present BL electric potential, an aid is required from an external I/O section. To put it more concretely, it is necessary to activate the column select line CSL shown in FIG. 12 in order to drive the bit line BL by making use of the LIO line pair including the local input/output line LIO and the inverted local input/output line /LIO. If, an aid is required from a section external to the memory-cell array section 1, however, the number of aforementioned operations that can be carried out concurrently is limited. Thus, a high update transfer rate cannot be obtained.

In the second place, as a method for realizing a high update transfer rate, as shown in FIGS. 15A and 15B, there is provided a method for carrying out operations similar to those in the read state of an SRAM. In accordance with this method, once the BL electric potential is initialized to the H level, the bit line BL is connected to the data latch circuit 71 so that the data held in the data latch circuit 71 is not destroyed after the initialization of the BL electric potential. In the case of this method, however, control based on the sequence to initialize the BL electric potential to the H level becomes complicated. In addition, in an operation to drive the BL electric potential to the L level, there is a transient period in which the BL electric potential instantaneously becomes the H level and it is feared that a disturbance caused by this transient phenomenon exists.

There is thus a demand for a simple circuit which can be used to realize a high transfer update rate, a simple sequence of operations and the small number of disturbances.

It is to be noted that a demand for BL driving based on only data sensing and latching is also described in Patent Document 3. In accordance with a technology disclosed in Patent Document 3, a set sequence with a low speed (a large data update pulse width) and a low voltage applied to the memory cell is implemented at an initial time. In the mean time, the sensed and latched data is updated. Since the time period to update the sensed and latched data is the time period of the set sequence, a load borne by the data sensing latch circuit and a load borne by the bit line BL are separated from each other in advance by a switch. Thereafter, only the bit line BL is driven to the H level by only the data sensing latch circuit.

In accordance with the technology disclosed in Patent Document 3, if the bit line BL is driven from the L level to the H level by making use of only the data sensing latch circuit, the stability of the data latch circuit like the one shown in FIG. 13A becomes an issue. That is to say, even in the case of the technology disclosed in Patent Document 3, it is necessary to adopt a method for driving the bit line BL by making use of only the data latch circuit.

The column configuration shown in FIG. 10 is capable of solving the problems raised by the typical comparison circuits described above.

Next, operations carried out by the column configuration shown in FIG. 10 are explained by referring to operation waveform diagrams each also referred to as a timing chart as follows. It is to be noted that the following description explains a data erase operation. By properly reversing the direction of biases and relations between electric potentials and by parity of reasoning, however, the following description can also be applied to a data write operation.

Read-to-Verify Operation for an Erase Operation

If the stability of the data latch circuit shown in FIG. 13A becomes a problem, the column configuration employing the voltage generation circuit 5D and the voltage changeover switch 5C as shown in FIG. 10 can be used as a desirable configuration for solving the problem. The following description explains a desirable embodiment implementing an operation method provided by the present invention to serve as a method to be adopted in a configuration which employs the voltage generation circuit 5D and the voltage changeover switch 5C.

FIGS. 16A to 16K are a plurality of diagrams each showing the operation waveform (or the timing chart) of a signal for a case in which it is necessary to apply an additional data erase pulse to the memory cell MC in the event of an erase failure detected in a first embodiment. In the diagram, the phrase "Verify Fail" denotes the erase failure of a data erase operation. On the other hand, FIGS. 17A to 17K are a plurality of diagrams each showing the operation waveform (or the timing chart) of a signal for a case in which it is not necessary to apply an additional erase pulse to the memory cell MC in the event of a data erase success detected in the first embodiment. In the event of an erase success, an erase inhibit state is established.

In an initial state leading ahead of a time T0 shown in FIGS. 16A to 16K, the write/erase driver 10 shown in FIG. 5 sets initial erase data on the LIO line pair which includes a local input/output line LIO and an inverted local input/output line /LIO as shown in FIGS. 16B1 and 16B2. In the operation sequence shown in FIGS. 16A to 16K, the voltage of a data erase pulse is applied to the bit line BL from the second data holding node of the data latch circuit 71 by way of the NMOS transistor 52 only at the first erase-pulse application time. The write/erase driver 10 inverts the initial erase data at the time T0 to result in the inverted logic of that of the typical comparison circuit. That is to say, the write/erase driver 10 sets the local input/output line LIO at the L level and the inverted local input/output line /LIO at the H level (LIO=L and /LIO=H).

In addition, in the initial state leading ahead of the time T0, each of the word line WL and the column select line CSL is at the L level indicating an inactivated state as shown by a timing charts of FIGS. 16A and 16C respectively whereas each of the BLI read enable signal /BLIRE and the BLI write enable signal /BLIWE is at the H level indicating an inactivated state as shown by a timing charts of FIGS. 16F1 and 16G. Thus, in the column circuit shown in FIG. 10, each of the access transistor AT, the NMOS transistor 72, the first switch (51) and the second switch (52) is in a turned-off state.

When the column select line CSL is put in an activated state at the time T0, each of the NMOS transistors 72 is put in a turned-on state so that the initial erase data set in the LIO line pair including the local input/output line LIO and the inverted local input/output line /LIO is passed on to the SBL pair including the sense bit line SBL and the inverted sense bit line /SBL as shown by FIG. 16J. At about the same time as the time T0, the SA (Sense Amplifier) enable signal SAE is put in an activated state as shown by FIG. 16D, causing the initial erase data to be held in the data latch circuit 71.

At a time T1, at which the SA enable signal SAE has already been put in an activated state, the initial erase data is held in the data latch circuit 71.

At the time T1, the column select line CSL is put in an inactivated state putting each of the NMOS transistors 72 in a turned-off state. Then, at a time T2, the electric potential of the BLI write enable signal /BLIWE is changed from the H level to the L level. Thus, a BL isolation write signal BLIW is stepped up, having the level thereof raised on a step-by-step basis during a period ending at a time T3 as shown by FIG. 16I.

To put it in detail, this stepping-up operation is carried out as follows. First of all, in the BLI driver 5A shown in FIG. 10, the signal output by the BLI select circuit 5B for controlling the NMOS transistor 52 is set at the L level at the time T2 in order to put the transfer gate circuit TG1 employed in the voltage changeover switch 5C in a turned-on state. It is to be noted that, so far, prior to the time T2, the signal output by the BLI select circuit 5B has been at the H level and the NMOS transistor 53 employed in the voltage changeover switch 5C has been therefore in the turned-on state, pulling down the BL isolation write signal BLIW output by the voltage changeover switch 5C to the GND level. As a result, after the time T2, the BL isolation write signal BLIW is controlled by the voltage generation circuit 5D.

In the voltage generation circuit 5D, the select transistors ST0 to ST10 are controlled by select signals SEL_X0 to SEL_X10 respectively. Notation SELX** shown by FIG. 16H represents the select state of these select transistors ST0 to ST10. To put it more concretely, notation xi shown in FIG. 16H where i=00 to 10 indicates that the select transistors ST0 to STi have been cumulatively put in a turned-on state by the select signals SEL_X0 to SEL_Xi respectively. For example, notation x01 indicates that the select transistor ST1 has been put in a turned-on state by the select signal SEL_X1 after the select transistor ST0 was put in a turned-on state by the select signal SEL_X0 whereas notation x02 indicates that the select transistor ST2 has been put in a turned-on state by the select signal SEL_X2 after the select transistors ST0 and ST1 were put in a turned-on state cumulatively by the select signals SEL_X0 and SEL_X1 respectively.

At the time T2, the select transistor ST0 is put in a turned-on state the by the select signal SEL_X0. Afterwards, during the period between the times T2 and T3, the number of select transistors STi turned on by their respective select signals SEL_Xi is being incremented by 1 at a time from 1 to 11. In this way, the BL isolation write signal BLIW is increased on a step-by-step basis in order to slowly put the NMOS transistor 52 in a turned-on state.

As described above, the voltage generation circuit 5D divides a voltage range from the reference voltage Vss (which is typically the ground voltage of 0 V) to the power-supply voltage Vdd into ten divisions which are used for stepping up the BLI electric potential on a step-by-step basis from the reference voltage Vss to the power-supply voltage Vdd. In this case, since the operation is an operation to write the initial erase data into the memory cell MC by way of the NMOS transistor 52, the BLI electric potential stepped up on a step-by-step basis from the reference voltage Vss to the power-supply voltage Vdd is the electric potential of the BL isolation write signal BLIW which is supplied to the gate electrode of the NMOS transistor 52. The number of voltage divisions is set at ten which is merely a typical number. That is to say, the number of voltage divisions can be set at a value which is greater or smaller than ten. By stepping up the BLI electric potential on a step-by-step basis from the reference voltage Vss to the power-supply voltage Vdd, the NMOS transistor 52 serving as a BLI control switch is connected to the bit line BL at a high connection impedance when the BL electric potential is still at the L level. Thus, the second data holding node of the data latch circuit 71 is capable of sustaining a state of normally holding the H electric potential of the initial erase data.

To put it in more detail, the connection impedance of the NMOS transistor 52 is initially high and then gradually reduced at ten steps of reduction. It is to be noted that the connection impedance of the NMOS transistor 52 can be perceived as the on resistance of the NMOS transistor 52. In the process of reducing the connection impedance of the NMOS transistor 52, every time the connection impedance is decreased at one step of reduction, due to an effect of a BL electric potential lower than the inverted BL electric potential appearing on the second data holding node of the data latch circuit 71, the inverted BL electric potential appearing on the second data holding node of the data latch circuit 71 goes down instantaneously from the H level. Due to the data holding power (or the recovery power) of the data latch circuit 71, however, the inverted BL electric potential appearing on the second data holding node of the data latch circuit 71 rises back to the H level. After the inverted BL electric potential appearing on the second data holding node of the data latch circuit 71 has been restored back to the H level, the voltage of the BL isolation write signal BLIW appearing on the gate electrode of the NMOS transistor 52 is again stepped up by one step in order to produce the next change in impedance. In this way, the electric potential appearing on the second data holding node of the data latch circuit 71 is reduced by a small decrease repeatedly several times but the small decrease in electric potential is not large enough to exceed an inversion threshold value of the data held by the data latch circuit 71. Thus, as a result, the data held by the data latch circuit 71 is not destroyed.

In the mean time, an electric charge corresponding to the small electric-potential decrease of the data latch circuit 71 is supplied to the data latch circuit 71 by way of the NMOS transistors 72 on a step-by-step basis. The electric charge propagates to the bit line BL by way of the NMOS transistor 52 as electric potential increases which appear on the bit line BL. Thus, the electric potential appearing on the bit line BL rises gradually as shown by FIG. 16K.

As a result, an erase bias is applied to the memory cell MC. The erase bias is the voltage of the data update pulse which is the aforementioned data erase pulse in this case.

At the time T3, the electric potential of the BLI write enable signal /BLIWE is changed from the L level to the H level of the inactivated state in order to put the NMOS transistor 52 in a turned-off state. At about the same time as the time T3, the electric potential of the BLI read enable signal /BLIRE is changed from the H level to the L level of the activated state in order to put the NMOS transistor 51 in a turned-on state. In addition, since the electric potential of the SA enable signal SAE is changed from the H level to the L level of the inactivated state, the data latch circuit 71 stops the activation process in a state of holding the initial erase data. On top of that, as shown by FIG. 16E, the electric potential of a reference control signal REC is changed from the L level to the H level of the activated state in order to put the NMOS transistor 25 in a turned-on state. Thus, a reference electric potential VREF is supplied to the second data holding node of the data latch circuit 71 to appear on the inverted sense bit line /SBL.

As a result of the control carried out as described above, since the NMOS transistor 51 has been put in a turned-on state, the sense bit line SBL has been connected to the bit line BL so that the sense bit line SBL is electrically charged to the BL electric potential, causing the electric potential appearing on the sense bit line SBL to rise abruptly as shown by FIG. 16J. On the other hand, the reference electric potential VREF supplied to the second data holding node of the data latch circuit 71 pulls down the electric potential appearing on the inverted sense bit line /SBL to the reference electric potential VREF also as shown by FIG. 16J.

In the mean time, the word line WL has been remaining at the H level as it is since the time T0. Thus, prior to the termination of the state of holding the BL electric potential at the fixed level of the initial erase data, that is, prior to the operation to put the NMOS transistor 52 in a turned-off state in order to discontinue the activation of the sense amplifier 7, the column circuit is in a state of applying the erase bias explained before to the memory cell MC.

When the state of holding the BL electric potential at the fixed level of the initial erase data is once terminated at the time T3, however, some of electric charge held by the bit line BL is used to electrically charge the sense bit line SBL as described above and also used as the read bias of a direct read-to-verify operation carried out after the data erase operation performed during the period between the times T0 and T3. Thus, as shown by FIG. 16K, the effective BL electric potential used as the read bias of the direct read-to-verify operation is automatically adjusted to a level lower than the level of an electric potential propagating to the bit line BL in the operation to write the initial erase data into the memory cell MC, that is, the level of an electric potential appearing on the bit line BL at the time T3 immediately leading ahead of the direct read-to-verify operation. As a result, the read bias of the direct read-to-verify operation is set to serve as a bias for causing a read current Ir to flow to the memory cell MC.

Since FIGS. 16A to 16K are timing diagrams given for a data erase operation ending up in failure, the resistance of the variable-resistance cell resistor Rcell employed in the memory cell MC remains at a relatively low value as it is. Thus, much electric charge is electrically discharged from the sense bit line SBL as shown by a big drop from the level at a time right after the time T3 to a level at a time T4 in FIG. 16J. As a result, at the time T4, the level of the electric potential appearing on sense bit line SBL becomes lower than the reference electric potential VREF which is appearing on the inverted sense bit line /SBL.

Later on, at the time T4, the sense amplifier 7 is put in an activated state again and the difference in electric potential between the sense bit line SBL and the inverted sense bit line /SBL is increased, being restored to a magnitude set at the time T1 at which the initial erase data has been set in the data latch circuit 71. At a time T5, the difference in electric potential between the sense bit line SBL and the inverted sense bit line /SBL eventually becomes equal to the level of the initial erase data which has been set at the time T1 in the data latch circuit 71.

After the time T5, the operations carried out between the times T2 and T4 are performed again in an attempt to increase the resistance of the variable-resistance cell resistor Rcell which is employed in the memory cell MC.

The operations carried out between the times T2 and T4 may need to be performed repeatedly. That is to say, the data erase operation and the direct read-to-verify operation following the data erase operation may need to be performed repeatedly. As a result of the repeated execution of the data erase operation and the direct read-to-verify operation following the data erase operation, the level of the electric potential appearing on sense bit line SBL may not become lower than the reference electric potential VREF appearing on the inverted sense bit line /SBL at the time T4 at the end of the BL electrical discharge process carried out between the times T3 and T4 as shown by FIG. 17J. If the level of the electric potential appearing on sense bit line SBL does not become lower than the reference electric potential VREF appearing on the inverted sense bit line /SBL at the time T4, the data erase operation is considered to be a successful data erase operation. That is to say, as a result of applying the erase pulse to the memory cell MC repeatedly several times, the resistance of the variable-resistance cell resistor Rcell employed in the memory cell MC has been increased to a sufficiently large value. In other words, the resistance of the variable-resistance cell resistor Rcell employed in the memory cell MC has been reset to the sufficiently large value. As a result, the electrical discharge process of the bit line BL does not discharge much electric charge from the bit line BL so that the level of the electric potential appearing on sense bit line SBL does not become lower than the reference electric potential VREF appearing on the inverted sense bit line /SBL at the time T4.

In the case of a successful data erase operation, when the sense amplifier 7 is put in an activated state again at the time T4, the inverted initial erase data held in the data latch circuit 71 is re-inverted, that is, the electric potential appearing on the sense bit line SBL is set at the Vdd level whereas the electric potential appearing on the inverted sense bit line /SBL is set at the Vss level at the time T5 as shown by FIG. 17J.

Thus, connected to the inverted sense bit line /SBL, the second data holding node of the data latch circuit 71 is also set at the Vss level. As a result, even if the BL isolation write signal BLIW is stepped up during the period between the times T5 and T6 as shown by FIG. 17I, the bit line BL is not electrically charged to increase the electric potential appearing on the bit line BL. As a matter of fact, the bit line BL is electrically discharged adversely to decrease the electric potential appearing on the bit line BL to the Vss level as shown by FIG. 17K.

As is obvious from the above descriptions, in the configuration of the column circuit shown in FIG. 10 and the operations carried out by the column circuit, the inversion of the initial erase data held in the data latch circuit 71 is an operation to establish an erase inhibit state.

In comparison with the typical comparison circuit shown in FIG. 12, only the NMOS transistor 52 is added to the column circuit to serve as a circuit element for automatically establishing an erase inhibit state. In comparison with the typical comparison circuit shown in FIGS. 14A and 14B1 to 14B3, on the other hand, the transfer inverter 95 is not required. Thus, elimination of the transfer inverter 95 rather makes the configuration of the column circuit simpler. It is to be noted that the BLI driver 5A shown in FIG. 10 is required. However, this BLI driver 5A can be shared by all memory-cell columns or a relatively large number of memory-cell columns. Thus, the necessity to employ the BLI driver 5A gives rise to neither a block nor a hindrance to efforts to raise the memory-cell density of the memory-cell array section 1.

In the typical comparison circuits shown in the circuit diagrams of FIG. 14 and the other figures, the electric potential of the BL isolation signal BLI is abruptly changed from the L level to the H level. Thus, the data latch circuit 71 enters a state like the one shown in FIGS. 13A and 13B as a state having a lack of stability.

In the configuration of the column circuit shown in FIG. 10 and the operations carried out by the column circuit, on the other hand, the control of the BL isolation write signal BLIW is carried out on a step-by-step basis. Thus, the initial erase data stored in the data latch circuit 71 is not destroyed or inverted inadvertently. As a result, this embodiment offers a merit that the reliability of the data latching operation is improved substantially.

Chapter 2

Second Embodiment

Figure 18:
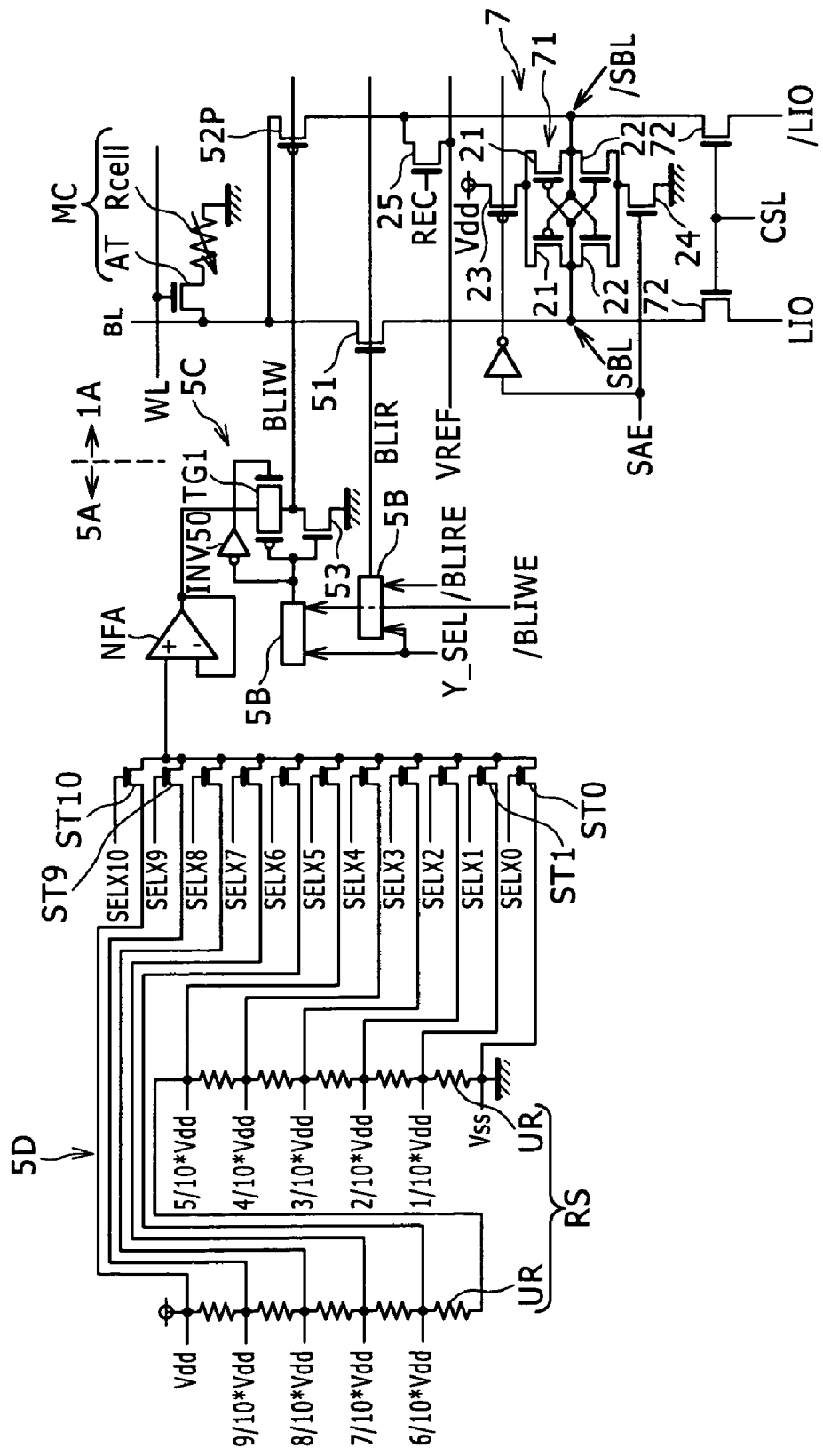
FIG. 18 is a circuit diagram showing the configurations of a column of memory cells and a BLI driver which are provided in accordance with a second embodiment of the present invention.

FIG. 18 is a circuit diagram showing the configurations of a column of memory cells and a BLI driver 5A which are provided in accordance with a second embodiment of the present invention. FIGS. 19A to 19K are a plurality of diagrams each showing the operation waveform (or the timing chart) of a signal for a case in which it is necessary to apply an additional data erase pulse to the memory cell MC in the event of an erase failure detected in the second embodiment. FIGS. 20A to 20K are a plurality of diagrams each showing the operation waveform (or the timing chart) of a signal for a case in which it is not necessary to apply an additional data erase pulse to the memory cell MC in the event of an erase success detected in the second embodiment.

The configuration of the column circuit shown in FIG. 18 is different from the configuration of the column circuit shown in FIG. 10 in that, the column circuit shown in FIG. 18 employs a PMOS transistor 52P in place of the NMOS transistor 52 employed in the column circuit shown in FIG. 10 to serve as the second switch (52).

In addition, select signals SEL_X0 to SEL_X10 in the voltage generation circuit 5D employed in the configuration shown in FIG. 10 are controlled by the control circuit 11 shown in FIG. 5 so that the select signals SEL_X0 to SEL_X10 are put in active state sequentially in an order the select signals SEL_X0 to SEL_X10 are enumerated. On the other hand, select signals SEL_X0 to SEL_X10 in the voltage generation circuit 5D employed in the configuration shown in FIG. 18 are controlled by the control circuit 11 shown in FIG. 5 so that the select signals SEL_X0 to SEL_X10 are put in active state sequentially in an order opposite to the order the select signals SEL_X0 to SEL_X10 are enumerated.

The configurations of the other sections employed in the column circuit shown in FIG. 18 are identical with the configurations of their respective counterpart sections employed in the column circuit shown in FIG. 10.

Figure 19:
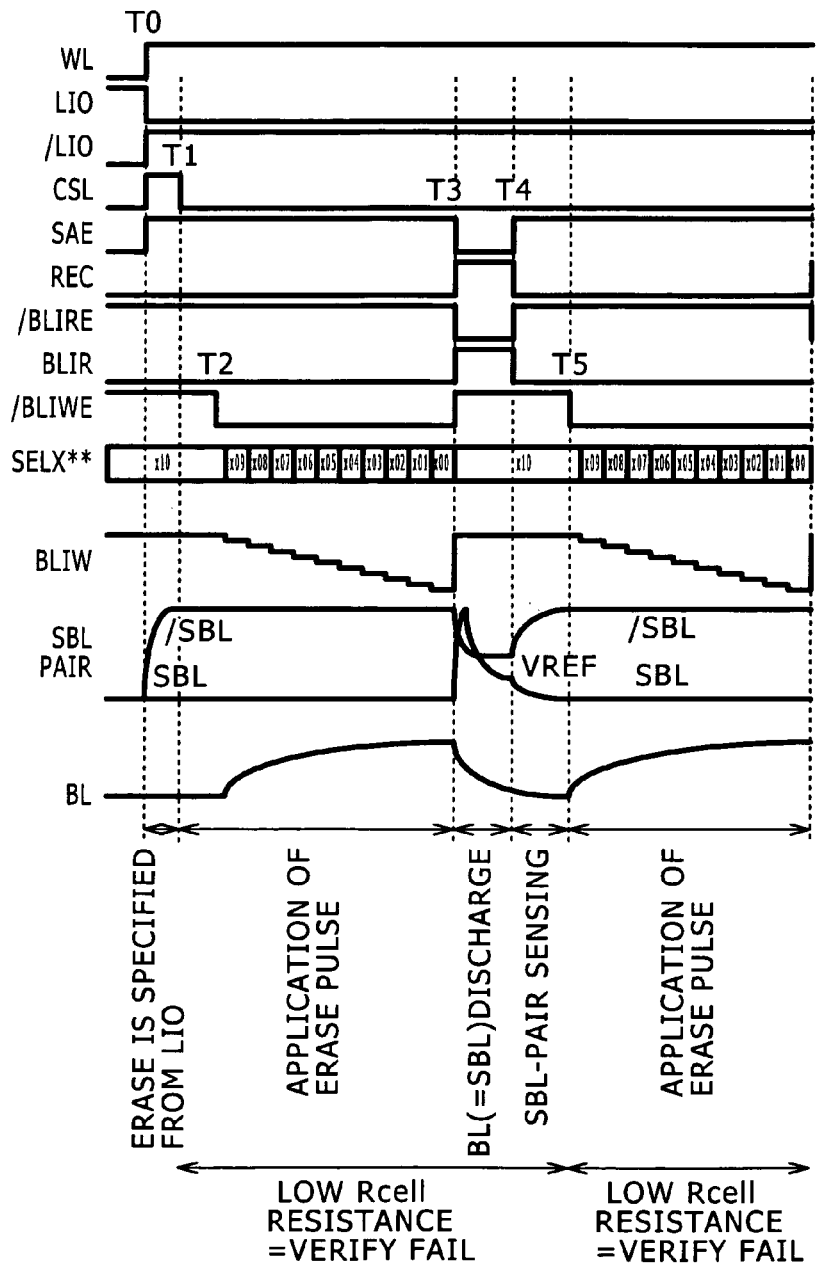
FIGS. 19A to 19K are a plurality of diagrams each showing the operation waveform (or the timing chart) of a signal for a case in which it is necessary to apply an additional data erase pulse to the memory cell in the event of an erase failure detected in the second embodiment.
Figure 20:
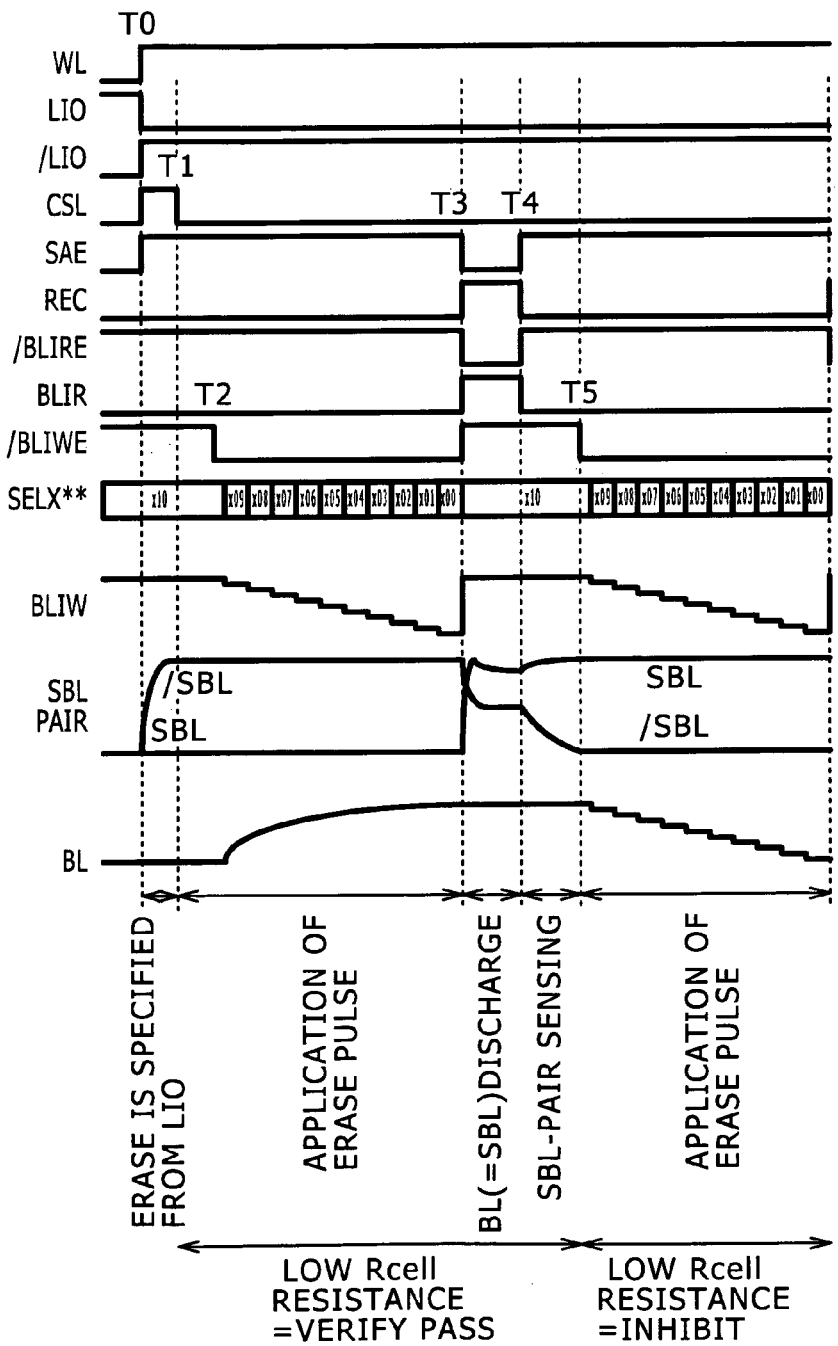
FIGS. 20A to 20K are a plurality of diagrams each showing the operation waveform (or the timing chart) of a signal for a case in which it is not necessary to apply an additional data erase pulse to the memory cell in the event of an erase success detected in the second embodiment.

Due to the above differences in configurations and control between the first embodiment shown in FIG. 10 and the second embodiment shown in FIG. 18, the BL isolation write signal BLIW is stepped down from the power-supply voltage Vdd to the reference voltage Vss on a step-by-step basis during a period between times T2 and T3 as shown by FIG. 19I.

At the time T2, the select transistor ST10 is put in a turned-on state the by the select signal SEL_X10. Afterwards, during the period between the times T2 and T3, the number of select transistors STi turned on by their respective select signals SEL_Xi is being incremented by 1 at a time from 1 to 11. In this way, the BL isolation write signal BLIW is decreased on a step-by-step basis in order to slowly put the NMOS transistor 52 in a turned-off state.

Since operations other than the operation to step down the BL isolation write signal BLIW on a step-by-step basis are the same as the other operations carried out by the first embodiment, the explanation of the other operations including the inhibit-state control operation is not repeated in order to avoid duplications of descriptions. The number of steps taken in the operation to step down the BL isolation write signal BLIW on a step-by-step basis is set at ten which is merely a typical number. That is to say, the number of steps taken in the operation to step down the BL isolation write signal BLIW on a step-by-step basis can be set at a value which is greater or smaller than ten.

Chapter 3

Configuration for Read Operations and Operations in the Configuration

The following description explains typical circuit configurations each designed in accordance with the first or second embodiment described above to serve as a circuit configuration for carrying out data read operations and explains typical operations carried out in each of the circuit configurations.

Figure 21:
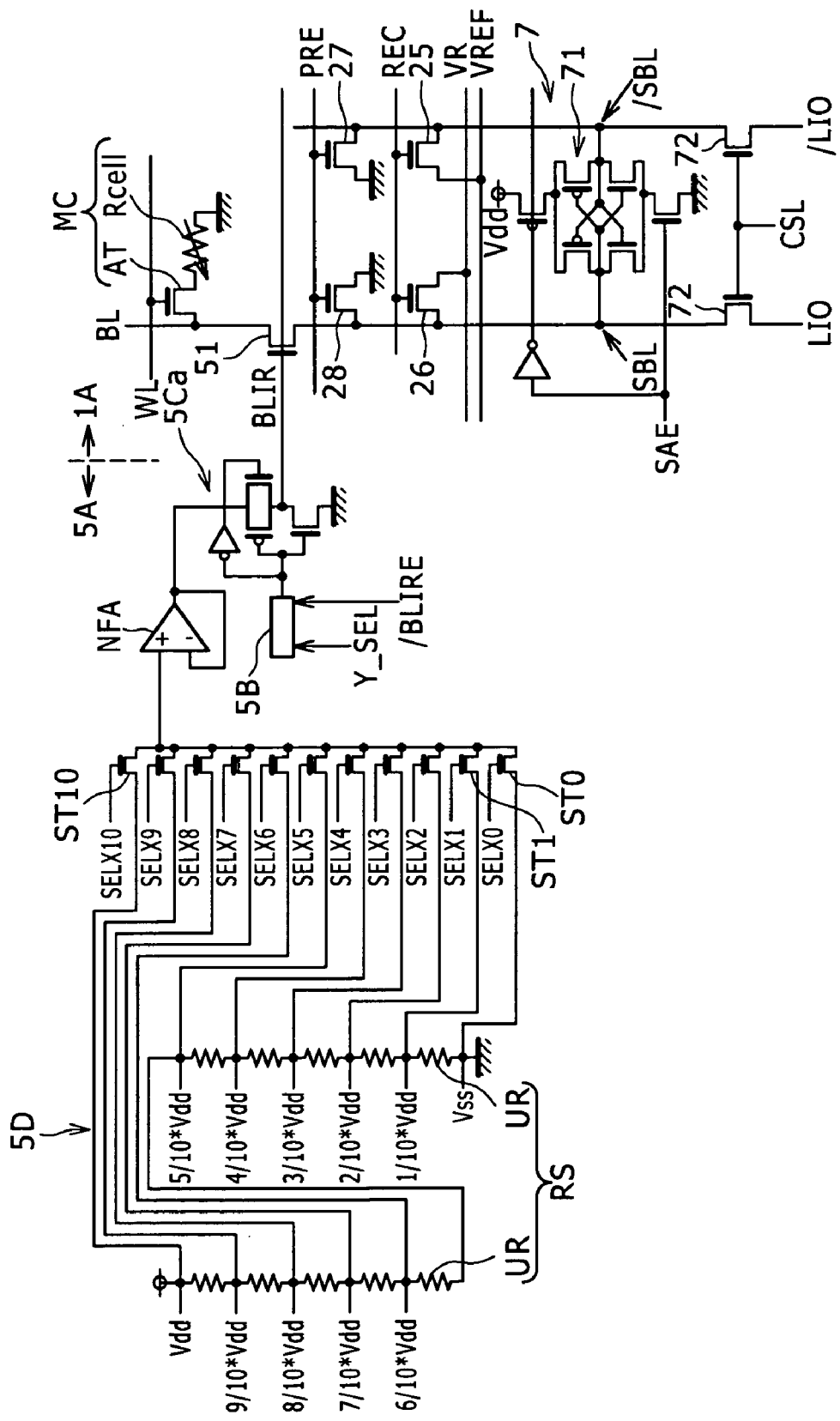
FIG. 21 is a circuit diagram showing the configuration of a memory-cell column provided for data read operations to serve as a memory-cell column implementable in the first or second embodiment and the configuration of a portion of a BLI driver provided for read operations to serve as a BLI driver implementable in the first or second embodiment.

FIG. 21 is a circuit diagram showing the configuration of a memory-cell column provided for data read operations. FIGS. 22A to 22I are a plurality of diagrams each showing the operation waveform (or the timing chart) of a signal generated in a data read operation carried out in the configurations shown in FIG. 21.

The column circuit configuration shown in FIG. 21 is identical with the column circuit configurations shown in the circuit diagrams of FIGS. 10 and 18 in that, like the column circuit configurations shown in the circuit diagrams of FIGS. 10 and 18, the column circuit configuration shown in FIG. 21 also includes a memory cell MC, a sense amplifier 7, two NMOS transistors 72, a first switch (51) and an NMOS transistor 25. It is to be noted that the other configuration components shown in the circuit diagrams of FIGS. 10 and 18 are also included in the column circuit configuration shown in FIG. 21 but not explicitly shown in FIG. 21.

In addition, the column circuit configuration shown in FIG. 21 also includes third additional NMOS transistors 26, 27 and 28. On top of that, the BLI driver 5A shown in FIG. 21 also includes an additional voltage changeover switch 5Ca.

It is to be noted that a voltage generation circuit 5D and a negative feedback amplifier NFA, which are shown in FIG. 21, are provided to serve as components for controlling the first switch (51). The voltage generation circuit 5D and the negative feedback amplifier NFA, which are employed in the BLI driver 5A shown in FIG. 21, can be provided separately from a configuration shown in FIG. 10 to serve as a configuration for controlling the second switch (52). It is desirable, however, to provide one pair including a voltage generation circuit 5D and a negative feedback amplifier NFA which are used as control components common to the configuration for controlling the first switch (51) and the configuration for controlling the second switch (52). In the case of the column configuration shown in FIG. 21, when the voltage changeover switch 5C is put in a turned-on state and the voltage changeover switch 5Ca is put in a turned-off state, the BLI driver 5A controls the second switch (52) but, when the voltage changeover switch 5C is put in a turned-off state and the voltage changeover switch 5Ca is put in a turned-on state, on the other hand, the BLI driver 5A controls the first switch (51).

In the column configuration shown in FIG. 21, in the same way as the column configuration shown in FIG. 10, the NMOS transistor 25 is controlled by the reference control signal REC. An NMOS transistor 26 also controlled by the reference control signal REC is connected between the sense bit line SBL and a line for supplying a read BL voltage VR. An NMOS transistor 27 is connected between the inverted sense bit line /SBL and a line for supplying the reference voltage Vss which is normally the voltage of the ground GND whereas an NMOS transistor 28 is connected between the sense bit line SBL and the line for supplying the reference voltage Vss. The NMOS transistor 27 and the NMOS transistor 28 are controlled by a pre-charge signal PRE.

Data Read Operations

Data read operations carried out in the column configuration described above are explained as follows.

Figure 22:
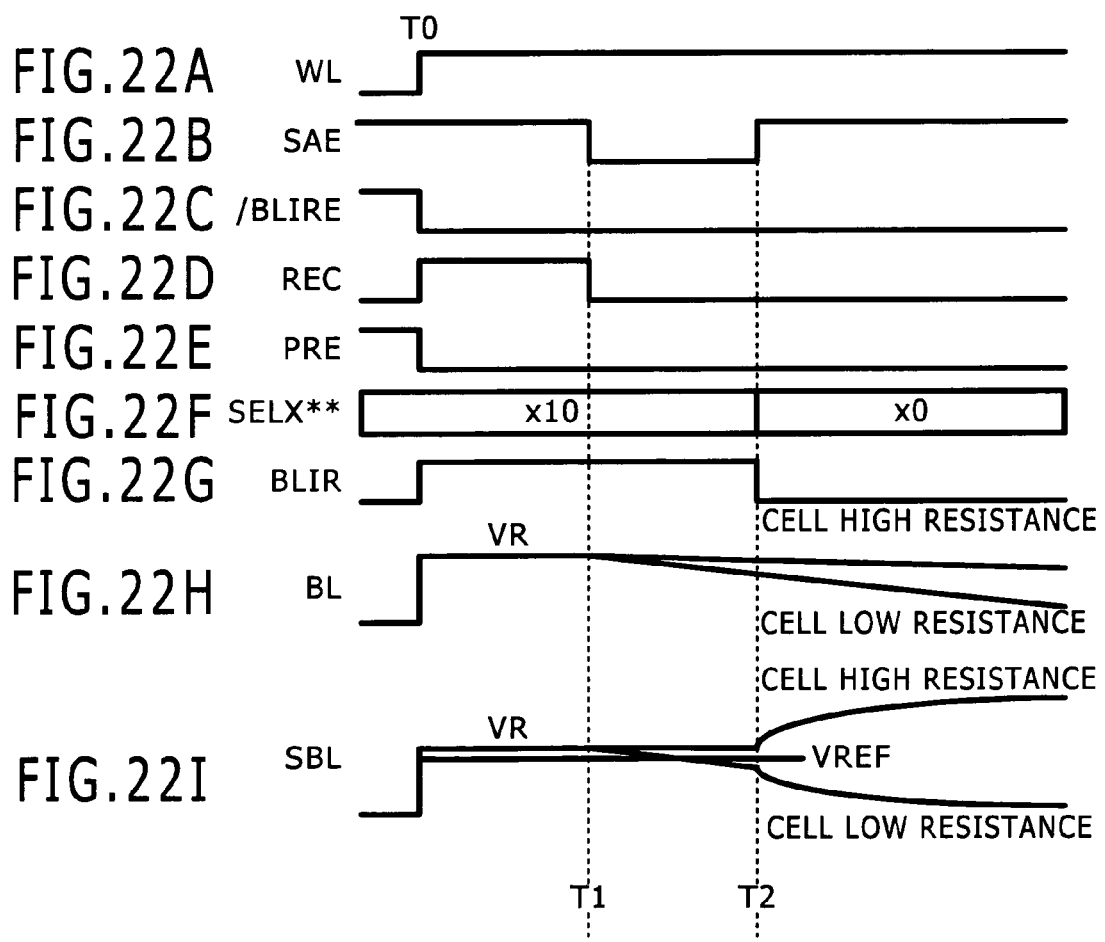
FIGS. 22A to 22I are a plurality of diagrams each showing the operation waveform (or the timing chart) of a signal generated in a data read operation carried out in the configurations shown in FIG. 21.

Before a data read operation is started at a time T0, the pre-charge signal PRE shown by FIG. 22E is at the H level sustaining each of the NMOS transistors 27 and 28 in a turned-on state whereas each of the BL electric potential and the SBL electric potential is sustained in a state of being reset at the reference voltage Vss as shown by timing charts of FIGS. 22H and 22I respectively. In addition, since the SA enable signal SAE is sustained at the H level as shown by FIG. 22B, power supplied by a power supply to the sense amplifier 7 is cut off. On top of that, the reference control signal REC is sustained at the L level of an inactivated state as shown by FIG. 22D.

In addition, prior to the time T0, the BLI read enable signal /BLIRE is sustained at the H level of an inactivated state as shown by FIG. 22C. Since the BLI read enable signal /BLIRE is supplied to a BLI select circuit 5B employed in the column configuration shown in FIG. 21, a signal output by the BLI select circuit 5B is sustained at the H level keeping a BL isolation read signal BLIR at the reference voltage Vss, which is typically the voltage of the ground GND, as shown by FIG. 22G.

At the time T0, the electric potential of the pre-charge signal PRE is changed from the H level to the L level as shown by FIG. 22E in order to put the NMOS transistor 28 in a turned-off state terminating a state of sustaining the bit line BL at the fixed Vss electric potential and in order to put the NMOS transistor 27 in a turned-off state terminating a state of sustaining the sense bit line SBL at the fixed Vss electric potential which is the electric potential of the ground GND. At the same time, the electric potential of the reference control signal REC is changed from the L level to the H level as shown by FIG. 22D in order to put each of the NMOS transistors 25 and 26 in a turned-on state. With the NMOS transistor 26 put in a turned-on state, the bit line BL is pre-charged to raise the BL electric potential to a read BL voltage VR. With the NMOS transistor 25 put in a turned-on state, the electric potential appearing on the sense bit line SBL is set at the reference electric potential VREF. At the same time, the word line WL is put in an activated state in order to put the access transistor AT employed in the memory cell MC in a turned-on state. Since the read BL voltage VR has a magnitude causing no disturbance to be generated in the memory cell MC, the data storage state of the memory cell MC does not change at that time.

In addition, at the time T0, the electric potential of the BLI read enable signal /BLIRE is changed from the H level to the L level as shown by FIG. 22C. Since the BLI read enable signal /BLIRE is supplied to the BLI select circuit 5B employed in the column configuration shown in FIG. 21, the signal output by the BLI select circuit 5B is changed from the H level to the L level, putting the voltage changeover switch 5Ca in a turned-on state. The state of selecting select transistors ST0 to ST10 employed in the BLI select circuit 5B included in the column configuration shown in FIG. 21 is shown by FIG. 22F. At the time T0, the select transistor ST10 has been put in a turned-on state. Thus, at the time T0, the BL isolation read signal BLIR output by the voltage changeover switch 5Ca is raised from the GND level to the Vdd level.

Then, at a time T1, the electric potential of the reference control signal REC is changed from the H level to the L level as shown by FIG. 22D in order to terminate the application of the read BL voltage VR and the reference electric potential VREF. At the same time, the electric potential of the SA enable signal SAE is changed from the H level to the L level as shown by FIG. 22B, and electric charge electrically precharged on the bit line BL and the sense bit line SBL respectively is electrically discharged to the ground GND through the memory cell MC. As a result of the process of discharging the electric charge charged on the bit line BL and the sense bit line SBL, the BL electric potential and the SBL electric potential decrease from the read BL voltage VR at a speed which is determined by the data storage state of the memory cell MC, that is, the resistance of the variable-resistance cell resistor Rcell employed in the memory cell MC. The process of discharging the electric charge charged on the bit line BL and the sense bit line SBL is carried out during a certain time period which ends at a time T2. The decrease of the BL electric potential is determined by the resistance of the variable-resistance cell resistor Rcell employed in the memory cell MC.

Even after the time T2, the BLI read enable signal /BLIRE remains at the L level as it is. At the time T2, however, the select transistor ST10 is put in a turned-off state whereas the select transistor ST0 is put in a turned-off state as shown by FIG. 22F. Thus, the electric potential of the BL isolation read signal BLIR is changed from the H level to the L level so that the first switch (51) shown in FIG. 21 is put in a turned-off state. At about the same time, since the electric potential of the SA enable signal SAE is changed from the H level to the L level, the sense amplifier 7 is put in an activated state, amplifying an electric-potential difference appearing on the SBL pair at the time T2 to a signal which has a Vdd amplitude.

The first switch (51) is put in a turned-off state at the time T2 prior to a data sensing operation as described above in order to prevent the memory cell MC from experiencing an update disturbance which would otherwise be caused by propagation of the SBL electric potential amplified by the data sensing operation to the bit line BL. The data sensing operation is an operation carried out by amplifying a difference between an electric potential appearing on the first data holding node of the data latch circuit 71 and an electric potential appearing on the second data holding node of the data latch circuit 71. The electric potential appearing on the first data holding node of the data latch circuit 71 is the SBL electric potential which has been changed by data stored in the memory cell MC prior to the data sensing operation. On the other hand, the electric potential appearing on the second data holding node of the data latch circuit 71 is an electric potential appearing on the inverted sense bit line /SBL which has been electrically charged to the reference electric potential VREF prior to the data sensing operation.

In the operations carried out by the first embodiment shown in FIG. 10 and the second embodiment shown in FIG. 18, in order to avoid inadvertent inversion of data stored in the data latch circuit 71, the voltage of a BL isolation write signal BLIW appearing on the gate electrode of a transistor serving as the BLI switch element also referred to as the second switch (52) is changed on a step-by-step basis so as to control the BLI-switch switching speed at which the BLI switch element is put in the turned-on state by the gradual changes of the voltage of the BL isolation write signal BLIW appearing on the gate electrode of the transistor serving as the BLI switch element. This technology can be applied to a volatile memory device such as the DRAM and the SRAM.

A typical application of this technology is explained below.

As described above, the first switch (51) is put in a turned-off state by making use of the function of the voltage generation circuit 5D. It is to be noted that control can also be carried out so as to change the level of the BL isolation read signal BLIR supplied to the gate electrode of the NMOS transistor 51 serving as the first switch (51) on a step-by-step basis.

Chapter 4

Typical Application to DRAMs

The present invention also relates to the circuit configuration of a DRAM having a 1T1C (one transistor and one capacitor) type and relates to operations carried out by such a DRAM.

Figure 23:
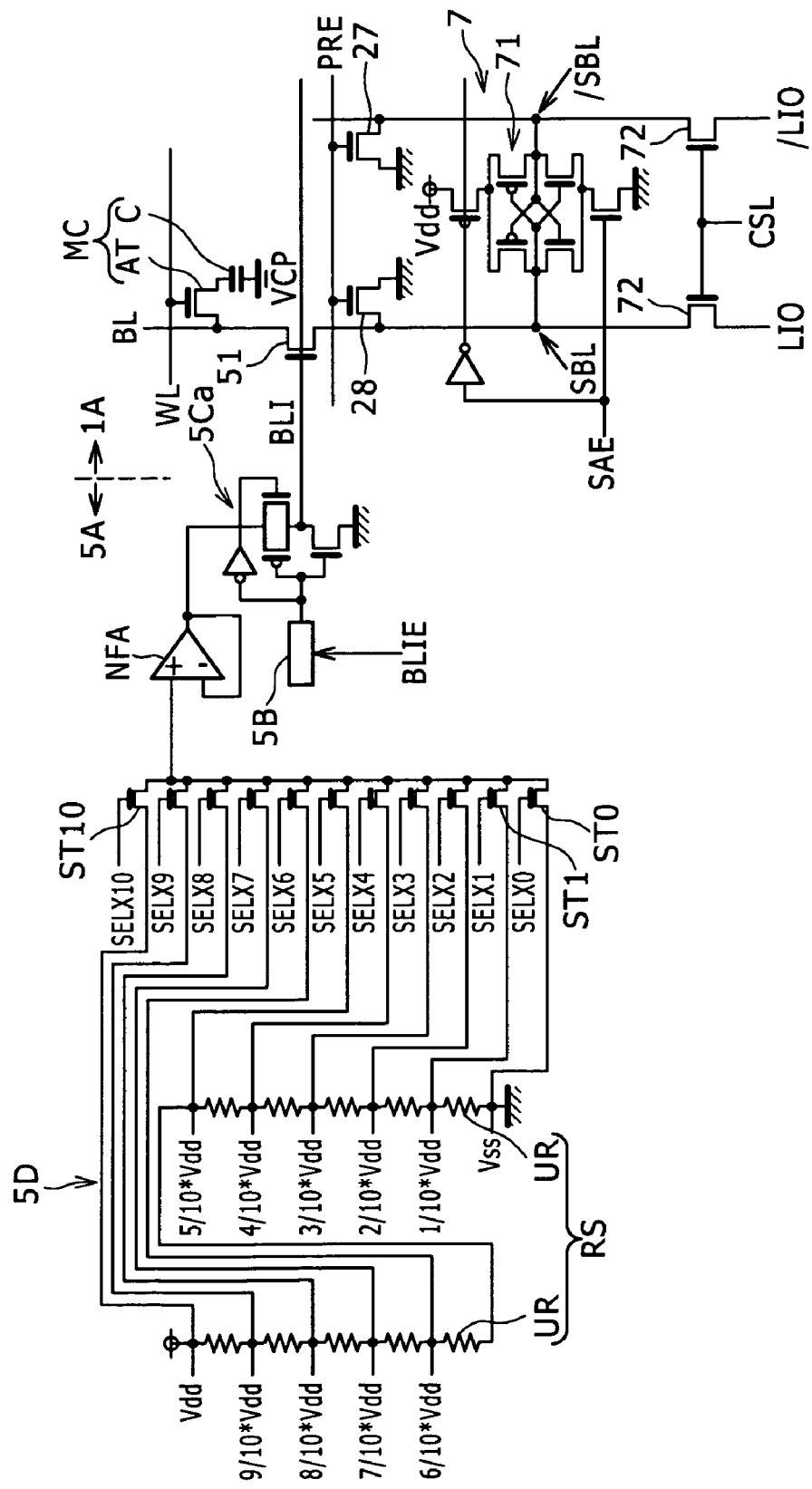
FIG. 23 is a circuit diagram showing the configuration of a memory-cell column provided for a technique applied to a DRAM to serve as a technique for controlling a first switch on a step-by-step basis and the configuration of a portion of a BLI driver provided for the same technique.

FIG. 23 is a circuit diagram showing the configuration of a memory-cell column provided for a technique applied to a DRAM to serve as a technique for controlling the first switch (51) on a step-by-step basis and the configuration of a portion of the BLI driver 5A provided for the same technique. FIGS. 24A to 24J are a plurality of diagrams each showing the operation waveform (or the timing chart) of a signal generated in the configurations shown in FIG. 23.

In comparison with the circuits shown in FIGS. 10, 18 and 21, the circuits shown in FIG. 23 employ a memory cell MC which has a DRAM configuration. In the DRAM configuration of the memory cell MC employed in the circuits shown in FIG. 23, an access transistor AT and a capacitor C are connected to each other in series between the bit line BL and a line which is used for supplying a constant voltage VCP.

In a DRAM, the bit line BL is put in a floating state after the bit line BL has been electrically discharged to the GND electric potential. With the bit line BL put in a floating state, the bit line BL is electrically charged to an electric potential determined by the amount of electrical charge which is held by the capacitor C employed in the memory cell MC. The existence or the non-existence of this electrical charging process of the bit line BL is detected in order to sense a voltage representing data stored in the capacitor C. As an alternative, the amount of electrical charge electrically charged to the bit line BL in this electrical charging process of the bit line BL is measured to sense a voltage representing data stored in the capacitor C.

Thus, the NMOS transistor 25 providing the reference electric potential VREF, the NMOS transistor 26 for providing the read BL voltage VR and a control line for providing the reference control signal REC as shown in FIG. 21 are not required in the column configuration shown in FIG. 23.

Other circuit components shown in FIG. 23 are identical with their counterpart circuit components shown in FIG. 21. The other circuit components shown in FIG. 23 are denoted by the same reference numerals as the counterpart circuit components shown in FIG. 21. In addition, the explanation of the other circuit components shown in FIG. 23 is not repeated in order to avoid duplications of descriptions.

In an ordinary DRAM, in a data read operation, the BL isolation read signal BLIR is set at the H level in order to connect the bit line BL to the sense bit line SBL. With the bit line BL connected to the sense bit line SBL, data is read out onto the sense bit line SBL from the memory cell MC through the bit line BL. The data appearing on the sense bit line SBL is then amplified by the sense amplifier 7.

In a data write operation, on the other hand, the column select line CSL is set at the H level in order to supply data to be written into the memory cell MC from the LIO line pair including the local input/output line LIO and the inverted local input/output line /LIO to the SBL pair including the sense bit line SBL and the inverted sense bit line /SBL by way of the two NMOS transistors 72. The data to be written into the memory cell MC is then inverted by the data latch circuit 71 employed in the sense amplifier 7 before being stored in the memory cell MC through the bit line BL.

Figure 24:
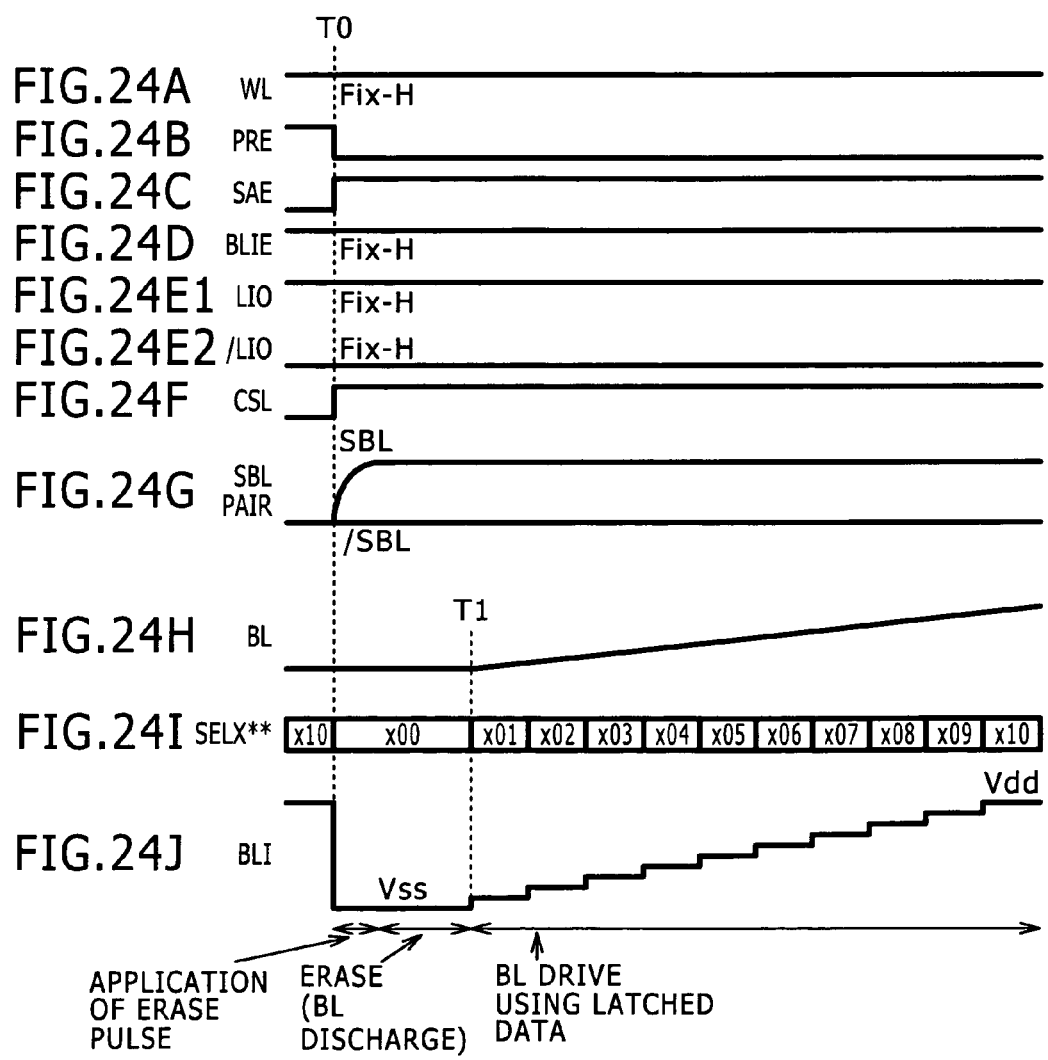
FIGS. 24A to 24J are a plurality of diagrams each showing the operation waveform (or the timing chart) of a signal generated in the configurations shown in FIG. 23.

In operations carried out in accordance with the timing diagram shown in FIGS. 24A to 24J by the DRAM assumed to have the configuration shown in FIG. 23, on the other hand, the DRAM is initially set prior to a time T0 in about the same way as the operations explained above by referring to FIGS. 22A to 22I. At the time T0, the electric potential of the pre-charge signal PRE is changed from the H level to the L level as shown by FIG. 24B in order to put each of the NMOS transistors 27 and 28 in a turned-off state. At about the same time, the electric potential of the SA enable signal SAE is changed from the L level to the H level as shown by FIG. 24C in order to put the sense amplifier 7 in an activated state. Also at about the same time, an electric potential appearing on the column select line CSL is changed from the L level to the H level as shown by FIG. 24F in order to supply data to be written into the memory cell MC from the LIO line pair including the local input/output line LIO and the inverted local input/output line /LIO shown by timing charts of FIGS. 24E1 and 24E2 to the SBL pair including the sense bit line SBL and the inverted sense bit line /SBL shown by FIG. 24G by way of the two NMOS transistors 72. The data to be written into the memory cell MC is then inverted by the data latch circuit 71 employed in the sense amplifier 7 before being stored in the memory cell MC through the bit line BL. Also at about the same time, the BL isolation signal BLI is changed from the Vdd level used as an H level to the Vss level serving as an L level as shown by FIG. 24J in accordance with control carried out by the voltage generation circuit 5D.

With the NMOS transistor 51 put in a turned-off state as it is, an operation to erase data from the memory cell MC is carried out even though this data erase operation is not shown in particular in FIGS. 24A to 24J. During a period starting at a time T1 which is a time after sufficiently long time has lapsed since the data erase operation, the BL isolation signal BLI is stepped up from the Vss level to the Vdd level on a step-by-step basis as shown by FIG. 24J in accordance with control carried out by the voltage generation circuit 5D shown in FIG. 23 to cumulatively put select transistors ST0 to ST10 sequentially in a turned-on state. As a result, an electric potential appearing on the bit line BL is gradually raised by data latched in the data latch circuit 71 as data to be written next into the memory cell MC as shown by FIG. 24H without destroying the latched data.

In this operation, it is not necessary to carry out a data read operation on a memory cell MC driven by the BL isolation signal BLI which has once made a transition to the H level in order to make a data update operation.

Chapter 5

Typical Application to SRAMs

The present invention also relates to the circuit configuration of an SRAM having a 6T (six transistors) type and relates to operations carried out by such an SRAM.

Figure 25:
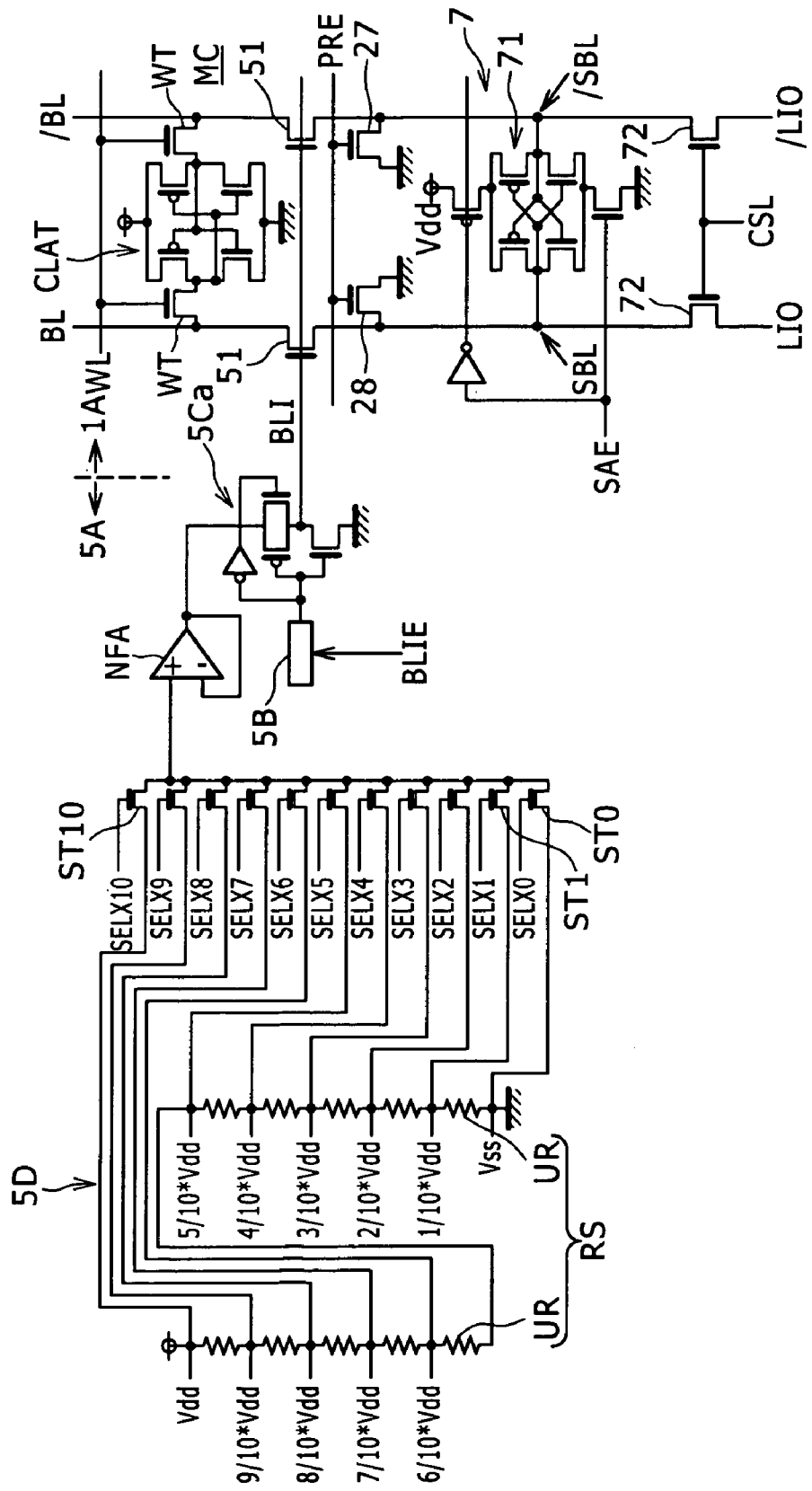
FIG. 25 is a circuit diagram showing the configuration of a memory-cell column provided for a technique applied to an SRAM to serve as a technique for controlling a first switch on a step-by-step basis and the configuration of a portion of a BLI driver provided for the same technique.

FIG. 25 is a circuit diagram showing the configuration of a memory-cell column provided for a technique applied to an SRAM to serve as a technique for controlling the first switch (51) on a step-by-step basis and the configuration of a portion of the BLI driver 5A provided for the same technique. FIGS. 26A to 26J are a plurality of diagrams each showing the operation waveform (or the timing chart) of a signal generated in the configurations shown in FIG. 25.

In comparison with the column circuit shown in FIG. 23, the memory cell MC employed in the column circuit shown in FIG. 25 has an SRAM configuration of the 6T type. To put it in more detail, the memory cell MC employed in the column circuit shown in FIG. 25 has two word transistors WT and a cell latch circuit CLAT provided between the two word transistors WT. The cell latch circuit CLAT is connected between a line for supplying the power-supply voltage Vdd and a line for supplying the reference voltage Vss. The cell latch circuit CLAT has two inverters connected in parallel to each other between the line for supplying the power-supply voltage Vdd and the line for supplying the reference voltage Vss. The output of a specific one of the two inverters is connected to the input of the other one of the two inverters whereas the input of the specific inverter is connected to the output of the other inverter. A specific one of the two word transistors WT is connected between a specific one of the two storage nodes of the cell latch circuit CLAT and the bit line BL whereas the other one of the two word transistors WT is connected between the other one of the two storage nodes of the cell latch circuit CLAT and an inverted bit line /BL. The gate electrodes of the two word transistors WT are connected to the word line WL.

In addition, in the column circuit shown in FIG. 25, another first switch (51) is connected between the inverted sense bit line /SBL and the inverted bit line /BL. Thus, the column circuit shown in FIG. 25 employs two first switches (51) which are both connected to a BL isolation signal BLI common to the two first switches (51).

Other circuit components shown in FIG. 25 are identical with their counterpart circuit components shown in FIG. 23. In addition, operations represented by FIGS. 26A to 26J are identical with the operations explained above by referring to FIGS. 24A to 24J.

In a data write operation carried out in an ordinary SRAM, a write driver outputting the BL electric potential or the /BL electric potential sets the BL electric potential or the /BL electric potential at the L level.

In an operation represented by FIGS. 26A to 26J, on the other hand, the column select line CSL is set at the H level first in order to latch data appearing on the LIO line pair including the local input/output line LIO and the inverted local input/output line /LIO in the data latch circuit 71 by inverting the data as explained above by referring to FIGS. 24A to 24J. At that time, the BL isolation signal BLI remains at the L level as it is. Even if the electric potential of the BL isolation signal BLI is stepped up on a step-by-step basis after that from the low Vss level to the high Vdd level, the data held by the data latch circuit 71 is not destroyed without regard to the level of the BL electric potential. That is to say, in a data update operation, it is not necessary to carry out a driving operation by making use a driver other than the sense/latch circuits.

Each of the first and second embodiments each described above to serve as an embodiment of the present invention implements a volatile or nonvolatile semiconductor memory device having a circuit configuration which is capable of carrying out the next update-pulse write setting operation and the inhibit-state setting operation for the bit line BL at a high speed by making use of a simple circuit after a read operation executed as a part of a direct read-to-verify operation. Each of the first and embodiments also implements an operation method for the volatile or nonvolatile semiconductor memory device.

In addition, as a desirable control technique, the BL isolation signal BLI for controlling a BLI switch is stepped up or stepped down in order to avoid inadvertent inversion of data latched in the data latch circuit. This technology for avoiding inversion of data latched in the data latch circuit offers a merit of simplifying the application of an operation, which does not require an external BL driver at a data update time, to a DRAM and an SRAM.

The present application contains subject matter related to that disclosed in Japanese Priority Patent Application JP 2009-180575 filed in the Japan Patent Office on Aug. 3, 2009, the entire content of which is hereby incorporated by reference.

It should be understood by those skilled in the art that various modifications, combinations, sub-combinations and alterations may occur depending on design requirements and other factor in so far as they are within the scope of the appended claims or the equivalents thereof.

What is claimed is:

1. A semiconductor memory device comprising:
   a bit line and a sense line;
   a data storage element having a data storage state changing in accordance with a voltage applied to said bit line;
   a first switch for controlling connection of said sense line to said bit line;
   a data latch circuit having a second data holding node and a first data holding node connected to said sense line; and
   a second switch for controlling connection of said second data holding node of said data latch circuit to said bit line; wherein
   at a data update time, said second switch is put in a turned-on state in order to apply a data update pulse to said data storage element on the basis of information appearing on said second data holding node;
   afterwards, said first switch is put in a turned-on state; and
   then, said data latch circuit carries out a read-to-verify operation to detect an electric potential appearing on said bit line by taking a reference electric potential supplied to said second data holding node as a comparison reference and then makes use of data latched after said read-to-verify operation as information for determining whether or not it is necessary to apply a next data update pulse to said data storage element.

2. The semiconductor memory device according to claim 1, said semiconductor memory device further having a voltage generation control section configured to change a control voltage supplied to said second switch at two or more successive steps in an operation to put said second switch in a turned-on state.

3. The semiconductor memory device according to claim 2 wherein said voltage generation control section steps up said control voltage applied to said second switch.

4. The semiconductor memory device according to claim 2 wherein said voltage generation control section steps down said control voltage applied to said second switch.

5. The semiconductor memory device according to claim 1 wherein, at the start of an operation to apply a data update pulse to said data storage element, an operation to put said second switch in a turned-on state is controlled so that said second switch is put in a turned-on state at a switching speed causing no inversion of data latched in said data latch circuit in an immediately preceding state.

6. The semiconductor memory device according to claim 3 wherein said second switch is a transistor of an negative channel type.

7. The semiconductor memory device according to claim 4 wherein said second switch is a transistor of a positive channel type.

8. The semiconductor memory device according to claim 1 wherein:
   said data storage element has two electrodes;
   between said two electrodes, an ion supplying layer is superposed on a storage layer to form a laminated body;
   said storage layer is made of an insulation material; and
   said ion supplying layer includes at least one of Cu, Ag and Zn and at least one of S, Se and Te.

9. A method for operating a semiconductor memory device including a data latch circuit, a bit line, a first switch, a second switch and a data storage element, said method comprising:
   (1) applying an inverted latched electric potential held at a second data holding node of said data latch circuit to serve as a bias to said bit line so as to make the data storage state of said data storage element connected to said bit line changeable by turning on said second switch for, controlling connection of said second data holding node to said bit line after turning off said first switch for controlling connection of a first data holding node of said data latch circuit to said bit line;
   (2) turning off said second switch; and
   (3) turning on said first switch and driving said data latch circuit to carry out a read-to-verify operation to detect an electric potential appearing on said bit line by taking reference information given to said second data holding node as a comparison reference,
   whereby said steps (1) to (3) are executed as a step sequence which is repeated a plurality of times and, right after said step (3) in each of said step sequences, latched data held in said data latch circuit is used as information for determining whether it is necessary to carry out said step (1) of applying a bias to said bit line after said step (3).

10. The method for operating a semiconductor memory device in accordance with claim 9 whereby said second switch is turned on at said step (1) by changing a control voltage applied to said second switch at two or more successive stages.

* * * * *